United States Patent [19]
Iga

[11] Patent Number: 5,798,963
[45] Date of Patent: Aug. 25, 1998

[54] INTEGRATED CIRCUIT STATIC WRITE—READ AND ERASE SEMICONDUCTOR MEMORY

[75] Inventor: Adam Sempa Iga, Alexandria, Va.

[73] Assignee: Hyundai Electronics Industries Co., Ltd., Seoul, Rep. of Korea

[21] Appl. No.: 414,383

[22] Filed: Mar. 31, 1995

[51] Int. Cl.$^6$ .................................................. G11C 17/02
[52] U.S. Cl. .......................... 365/97; 365/218; 365/225.5
[58] Field of Search .................................. 365/48, 50, 66, 365/97, 33, 55, 84, 98, 154, 155, 179, 225.5, 188, 218

[56] References Cited

U.S. PATENT DOCUMENTS

| | | | |
|---|---|---|---|
| 3,309,642 | 3/1967 | Grancoin . | |
| 3,348,184 | 10/1967 | Halla . | |
| 3,366,908 | 1/1968 | Weiss . | |
| 3,373,247 | 3/1968 | Hyland . | |
| 3,435,323 | 3/1969 | Wieder . | |
| 3,443,036 | 5/1969 | Maass . | |
| 3,858,190 | 12/1974 | Friedman | 365/48 |
| 5,313,096 | 5/1994 | Eide . | |
| 5,329,486 | 7/1994 | Lage | 365/66 |

OTHER PUBLICATIONS

Computer Organization by V. Carl Hamacher, Zvorko G. Vramesic and Safwat G. Zaky, Third Edition by McGraw Hill Publishing, pp. 321–322, Copyright 1990.

Analysis and Design of Digital Integrated Circuits by David A. Hodges and Horace G. Jackson, Second Edition by McGraw Hill Publishing, pp. 353 and 354, Copyright 1988.

*Primary Examiner*—David C. Nelms
*Assistant Examiner*—Son Dinh

[57] ABSTRACT

An imporved integrated circuit semiconductor static write and read and erase memory cell for storing in both one and more than one bit of binary data, having a switching transistor (M20) for switching on the memory cell, a data write bit line (26) for writing data into the cell using a column write and read and erase sense circuit (46), a data read bit line (28) for reading data stored in the memory cell, data erase bit line (32) for erasing data stored in the memory cell, a magnetic or electromagnetic element (36) for storing data in form of electromagnetism, a data reading element (34) for reading the data stored as magnetism or electromagnetism, an output current and output voltage bit line (35) for providing an output connection to a column write and read and erase sense circuit (46).

20 Claims, 14 Drawing Sheets

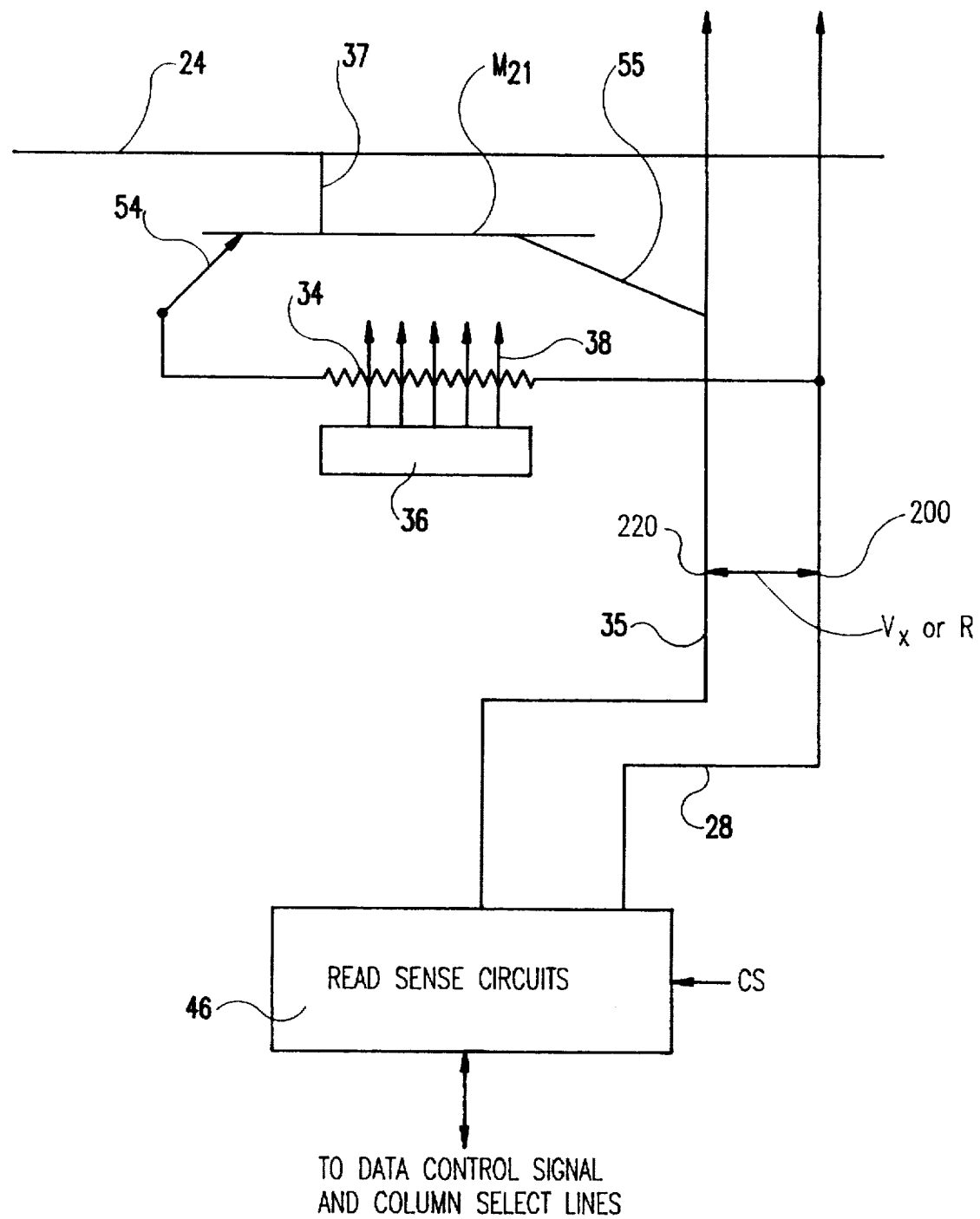
FIG.3B1
(BIPOLAR TECHNOLOGY)

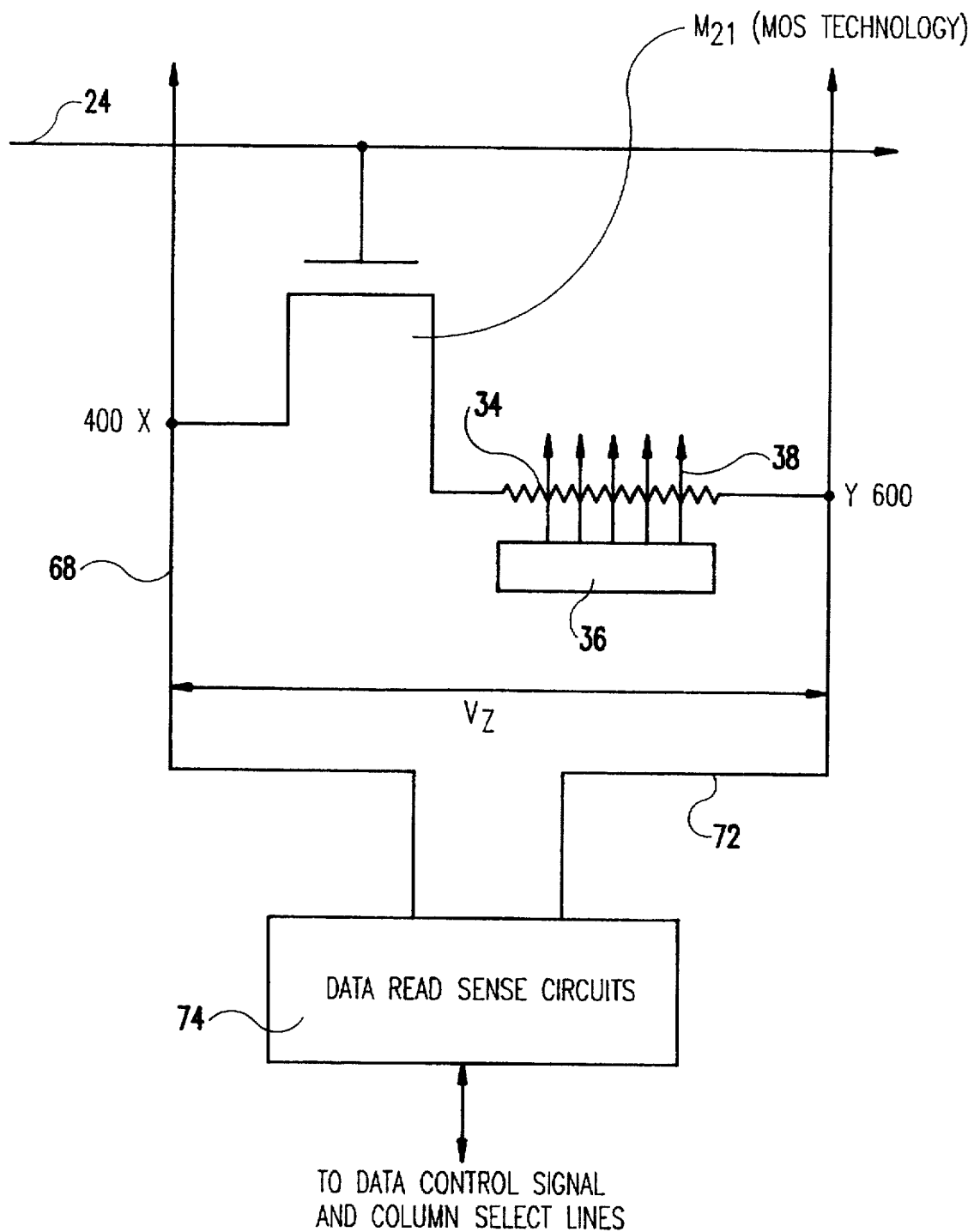
FIG. 3B2

(BIPOLAR TECHNOLOGY)

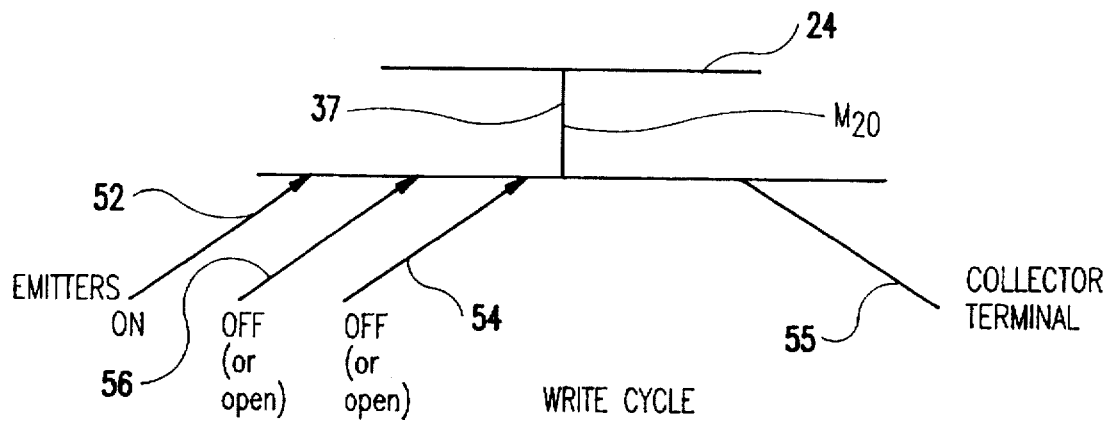
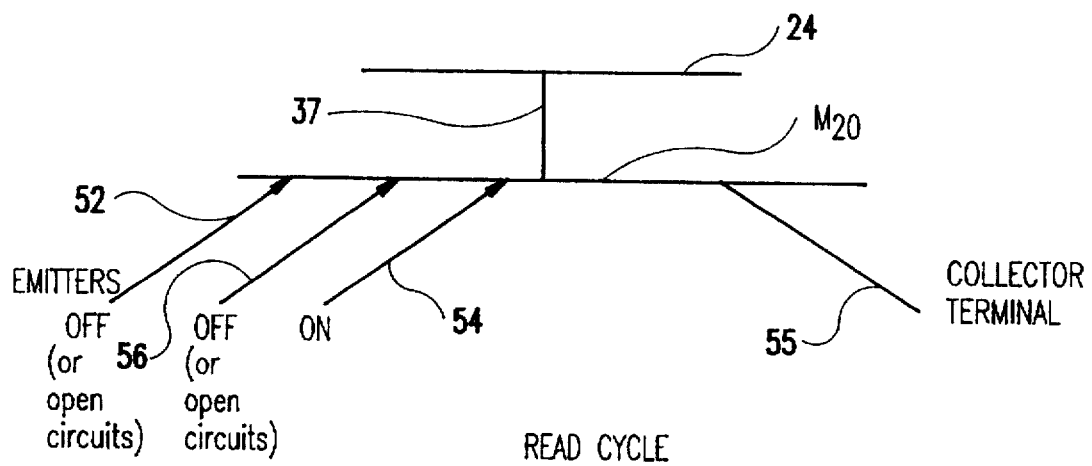
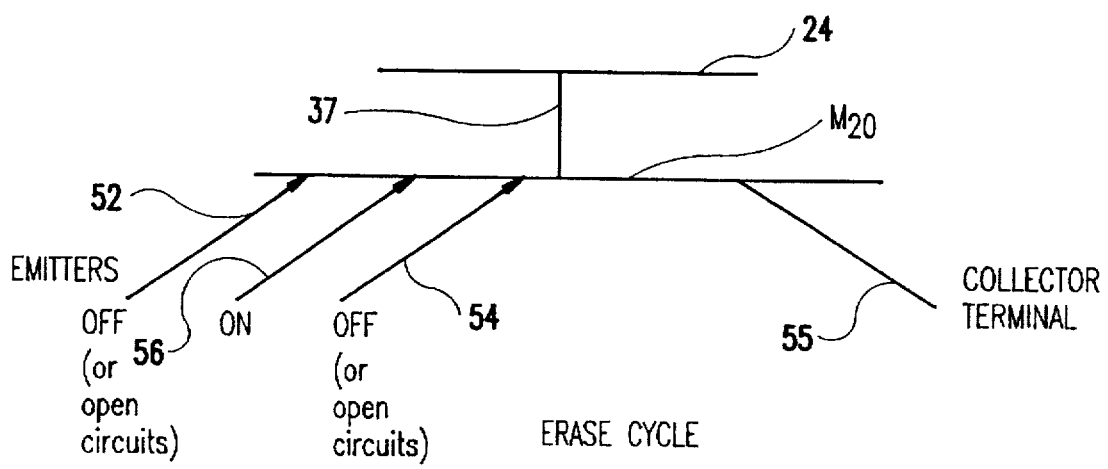
FIG.7
(BIPOLAR TECHNOLOGY)

FIG. 8 (BIPOLAR TECHNOLOGY)

|  | INPUT | | | OUTPUT |
| --- | --- | --- | --- | --- |
|  | $E_{52}$ | $E_{54}$ | $E_{56}$ | $C_{55} = V_{O2}$ |
| WRITE CYCLE<br>INPUT AND OUTPUT APPLY TO BOTH FIRST AND SECOND EMBODIMENTS | 1<br>(ON) | 0<br>(OFF, LOW OR OPEN CRKT) | 0<br>(OFF, LOW OR OPEN CRKT) | = 1 |
| READ CYCLE<br>INPUT APPLIES TO BOTH FIRST AND SECOND EMBODIMENTS<br>OUTPUT APPLIES TO FIRST EMBODIMENT ONLY | 0<br>(OFF, LOW OR OPEN CRKT) | 1<br>(ON) | 0<br>(OFF, LOW OR OPEN CRKT) | = 1<br>HIGH FOR A ONE, LOW FOR A ZERO |
| ERASE CYCLE<br>INPUT AND OUTPUT APPLY TO BOTH FIRST AND SECOND EMBODIMENTS | 0<br>(OFF, LOW OR OPEN CRKT) | 0<br>(OFF, LOW OR OPEN CRKT) | 1<br>(ON) | = 1 |

FIG.10

(MOS TECHNOLOGY ROW ARRAY)

INTEGRATED CIRCUIT STATIC WRITE—READ AND ERASE SEMICONDUCTOR MEMORY

CROSS-REFERENCE TO RELATED APPLICATION

This application is related to patent application Ser. No. 08/232,806, filed on Apr. 25, 1994 and now abandoned.

BACKGROUND OF THE INVENTION

1. Field of the Invention

The present invention relates to an improved apparatus and method for storing data for computers and other digital systems and, specifically, to an improved one transistor static write and read and erase memory cell for storing one than one bit of data in its second and third embodiments. The invention in its three embodiments can keep the data stored in the memory cell even when the power supply to the computer or digital system is switched off.

2. Description of the Prior Art

In the prior art, several types of static write and read (SRAM) data storage memory cells exist. In one such prior art embodiment used in a NOR cell array, a circuit with two gates and two capacitors as shown in FIG. 1A and FIG. 1B is used. Data is stored in the first gate by insulating the gate with silicon dioxide so data can be stored in the insulated capacitor for many years. To erase data stored in the cell, a strong ultraviolet light (UV) is used to expose the cell because the ultraviolet light renders the silicon dioxide insulation slightly conducting. Hence the charge stored on the capacitor is lost.

Another form of prior art embodiment is the static read and write memory cell shown in FIG. 2A and FIG. 2B. Both NMOS and CMOS technologies are used.

Other forms of prior art embodiments for SRAM memory cells that store data for digital systems exist. However, in all these prior art embodiments, there is a need to make the number of components comprising a single memory cell much smaller than is presently the case to facilitate putting more memory cells per area on an integrated circuit memory chip. In addition, there is a need to increase the amount of data each memory cell can hold at any one time. All existing memory cells, whether static or dynamic, now stored one bit of data per memory cell at a time.

SUMMARY OF THE INVENTION

It is therefore the primary object of this invention to provide a memory cell apparatus that is reduced in the number of components or elements and an improved method for storing one bit of data in a one transistor static write and read and erase memory cell.

Another object of this invention is to provide an improved memory cell apparatus and method for storing one or more bits of data at a given time, such data to be used for computers and other digital systems.

Another object of this invention is to provided an improved memory cell apparatus and method for storing large amounts of bits of binary data, that can be used as RAM for onboard main memory of computers and other digital systems.

Another object of this invention is to provide an improved memory cell apparatus and method for storing large amounts of data that can also be used as ROM for on board main memory for computers and other digital systems.

Another object of this invention is to provide an improved apparatus and method for a static memory cell that can be built into an array of identical memory cells in a memory cartridge for recording thereon vide, audio and computer data, whereby the recording and playback of such data is done by special purpose recorders with no moving parts.

Another object of this invention is to provide an improved apparatus and method for a memory cell that can be built into an array of identical memory cells on a memory card for recording thereon video, audio and computer data.

Another object of my invention is to provide an improved apparatus and method for storing large amounts of data permanently in a write and read and erase format as on board main memory for computers and other digital systems and by so doing drastically reduce the amount of energy in electrical power used to operate comparable data storage capacity peripheral memory systems such as magnetic disks, magnetic tapes and CD-ROMs.

Other objects and advantages of my invention will become more apparent to the reader who is well knowledgeable in this area, from the following drawings and the accompanying detailed description of the preferred embodiments.

DESCRIPTION OF THE DRAWINGS

The drawing in FIG. 1A is prior art showing a memory cell structure used in the erasable static read-write memory, also called the EPROM. Initially, there is no charge on the floating gate 2 so that gate 4, the drain 6, and source 8 are all grounded. As the voltage on gate 4 is increased, the gate 2 voltage also rises slowly and is determined by the capacitive driver $C_{14}$-$C_{12}$. Hence the threshold voltage ($V_T$) of transistor M10 as seen from gate 4 is raised. When it raises about twice as much as the threshold voltage ($V_T$), a channel forms and hence the circuit provides a positive logic stored zero when used in a NOR array.

To write a zero in the cell, both gate 4 and the drain 6 are raised to about 25 volts, while the Source 8 and the substrate 10 remain grounded. As a result, a large drain current flows due to normal device conduction characteristics and a high field in the drain substrate depletion region results in an avalanche breakdown of the drain—substrate junction with an additional flow of current. Electrons are accelerated to a high velocity through the thin oxide and become trapped on gate 2. When finally gate 4 and the drain 6 are reduced to their potential of zero volts, the negative charge on gate 2 forces its potential to about minus 5 volts. If gate 4 voltage for reading is limited to plus 5 volts, a channel does not form and hence a one is stored in the cell. Data is erased by exposing the cell to an ultraviolet (UV) light that renders the gate 2 insulation of silicon dioxide ($SiO_2$) conducting and hence makes the charge stored therein to leak out.

Figure 1A:
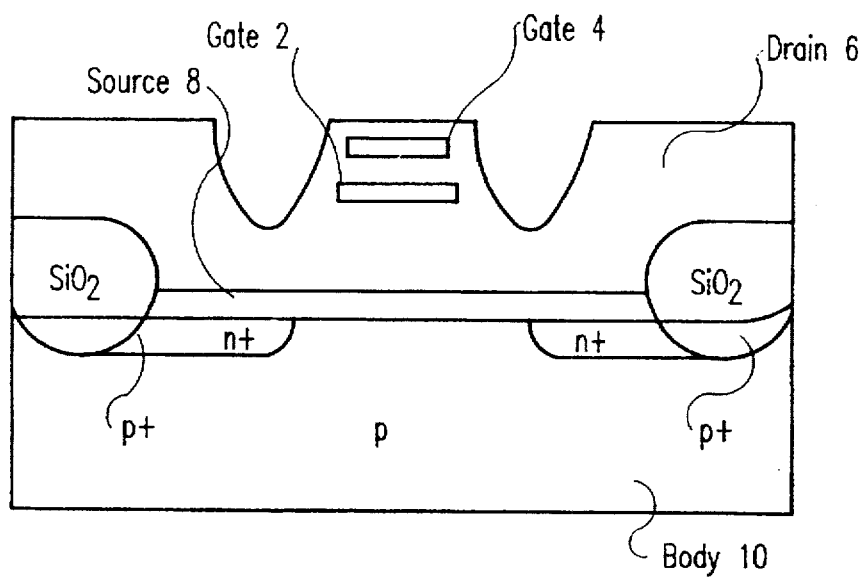
Figure 1B:
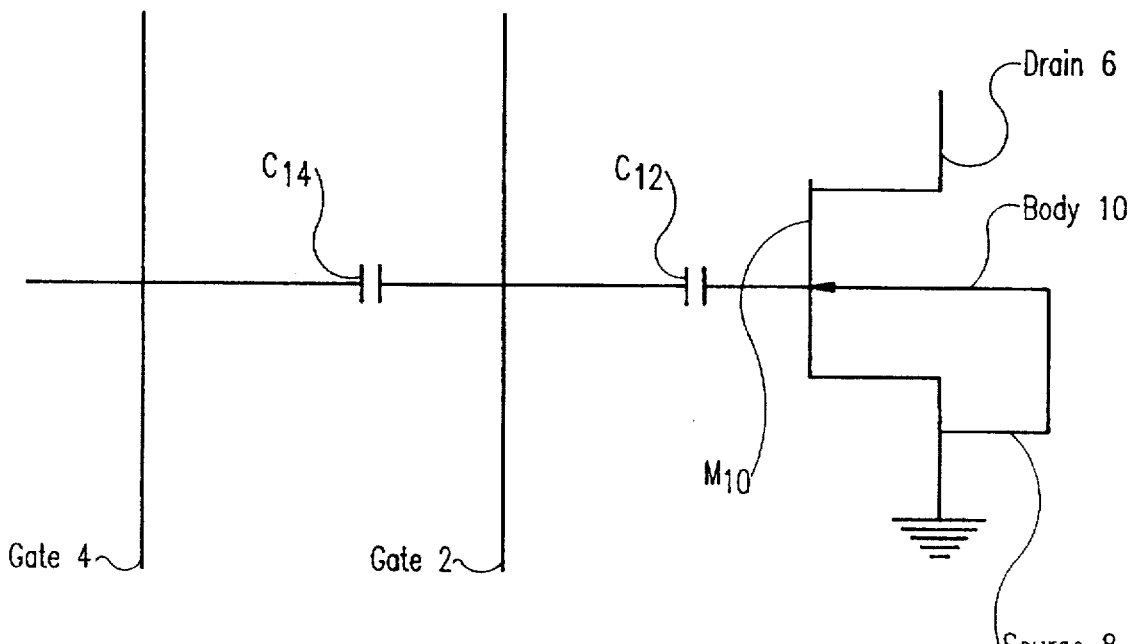

The drawing in FIG. 1B is a schematic diagram of the drawing in FIG. 1A, clearly showing gate 2, gate 4, storage capacitor 12, capacitor 14 and transistor M10.

Figure 2A:
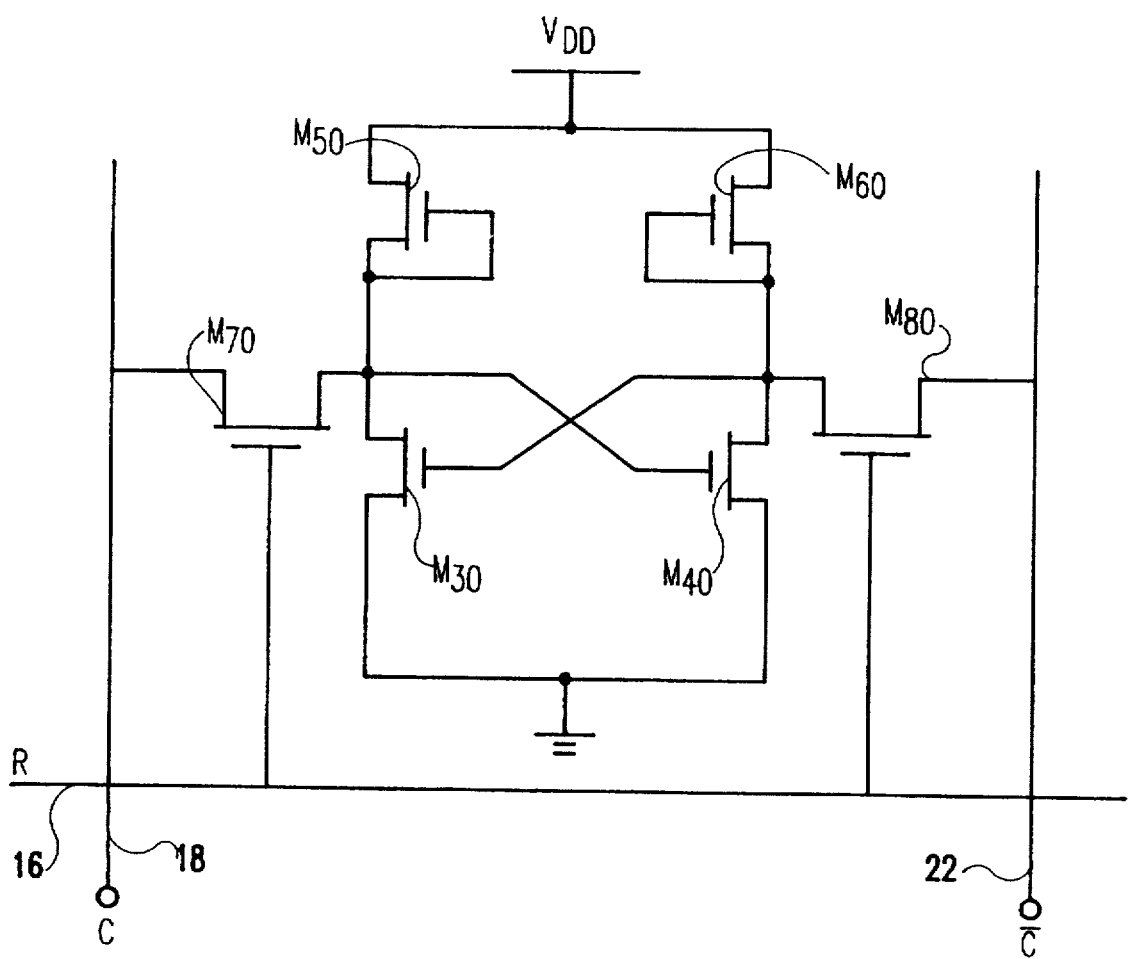

The drawing in FIG. 2A is prior art showing a static read and write memory cell based on NMOS—technology. The cell employs a cross-coupled pair of inverters M30, M40, M50 and M60 as storage flip-flops, while M70 and M80 provide a switchable data path into and out of the memory cell.

Figure 2B:
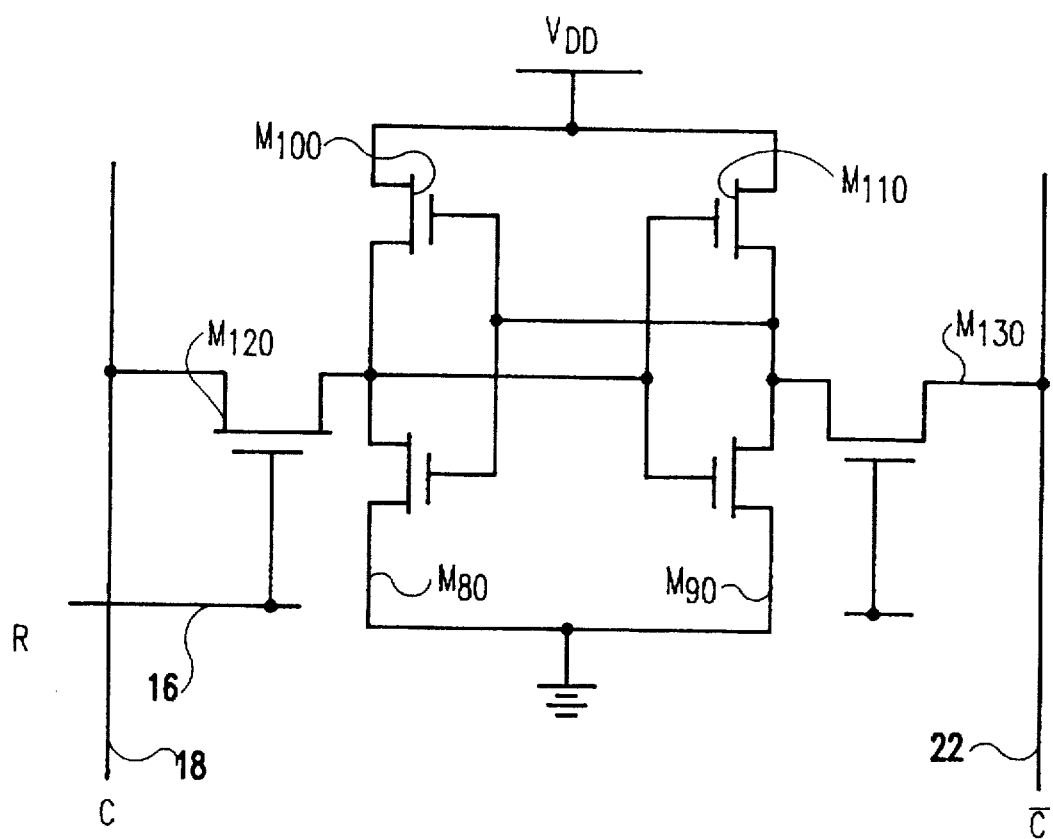

The drawing in FIG. 2B is prior art showing a static read-write memory cell based on CMOS technology. The data is stored in the cell that employs a cross-coupled pair of inverters M80, M90, M100 and M110 as storage flip-flops while transistors M120 and M130 provide a switchable data path into and out of the cell.

In both FIG. 2A and FIG. 2B row select line is 16 while column lines 18 and 22 are used as data path lines.

Figure 3A:
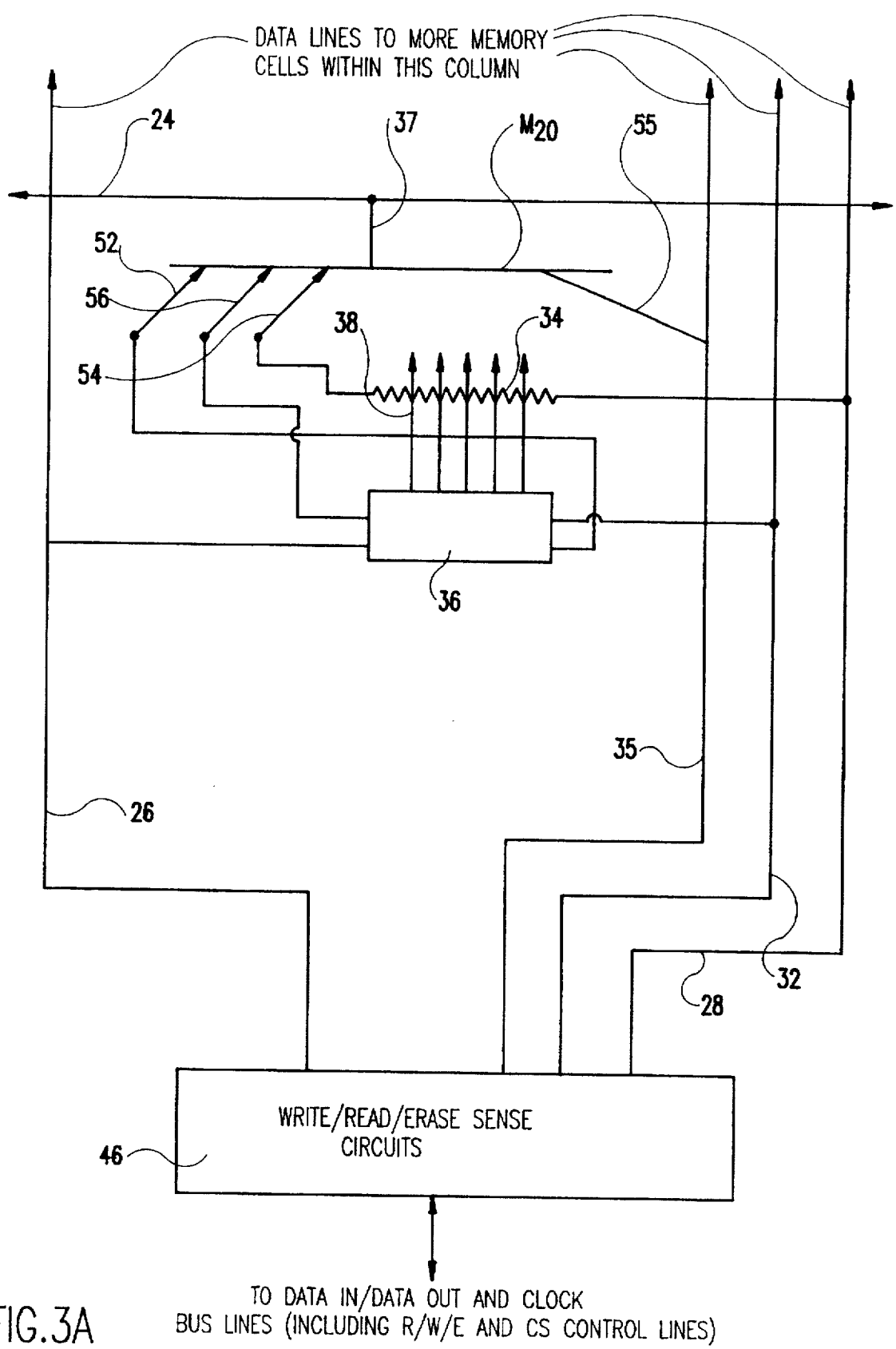

The drawing in FIG. 3A is a single one transistor static write and read and erase (SRAM) memory cell as described in both the first and second embodiments of this invention. Transistor M20 is switched on by row select line 24, while data write line 26 is used for writing data. Data read line 28 is used for reading data, while data erase line 32 is used to erase data. The data reading element 34 is in appropriate physical proximity to electromagnetic element 36, so that the electromagnetic field 38 in a specified direction crosses the body of element 34.

The drawing in FIG. 3B1 is a single transistor read-only memory cell (ROM) based on BJT technology in the third embodiment of this invention. Both data write line 26 and data erase line 32 are removed from the drawing in FIG. 3A to leave the schematic drawings shown in this figure because data is written in the cell (ROM) at the time of manufacture and is non-erasable. Also data write current and voltage input emitter 52 and data erase current and voltage input emitter 56 both of transistor M20 are removed so that transistor M20 now becomes transistor M21 with only one emitter.

The drawing in FIG. 3B2 is a single transistor read-only memory cell based on MOS technology. Data read line 68 is activated by the read sense circuits 74 which are in turn connected between data line 72 and the mentioned data read line 68 on which a read voltage and a corresponding read current are applied. The sense circuits are therefore able to measure the total voltage between point 400 and point 600 and in so doing measure the voltage across data reading element 34 that is proportional to the amount of data stored in the memory cell at the time.

Figure 4A:
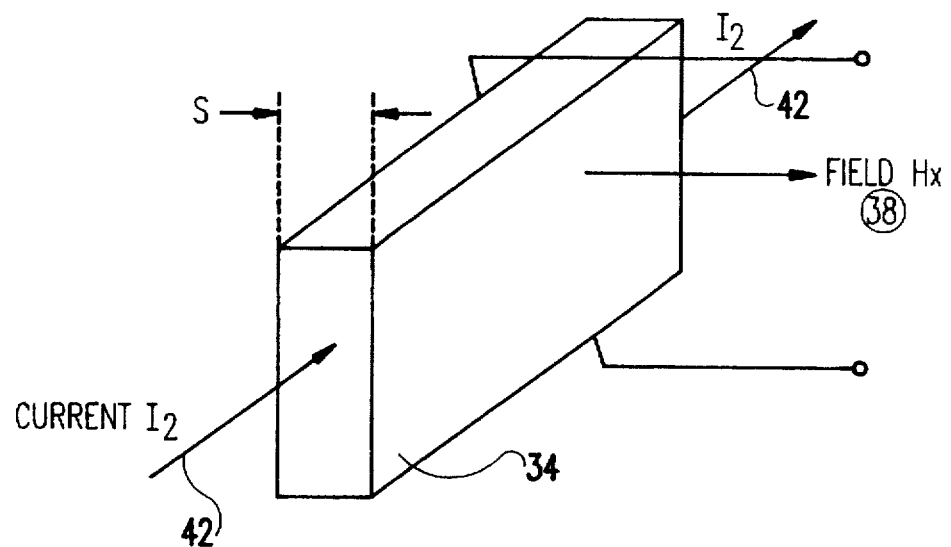

The drawing in FIG. 4A shows how data reading element 34 may be that of the semiconductor Indium Antimonide and how the voltage across its terminals changes in the presence of an electromagnetic field 38 when a current 42 is passed through its terminals as shown.

Figure 4B:
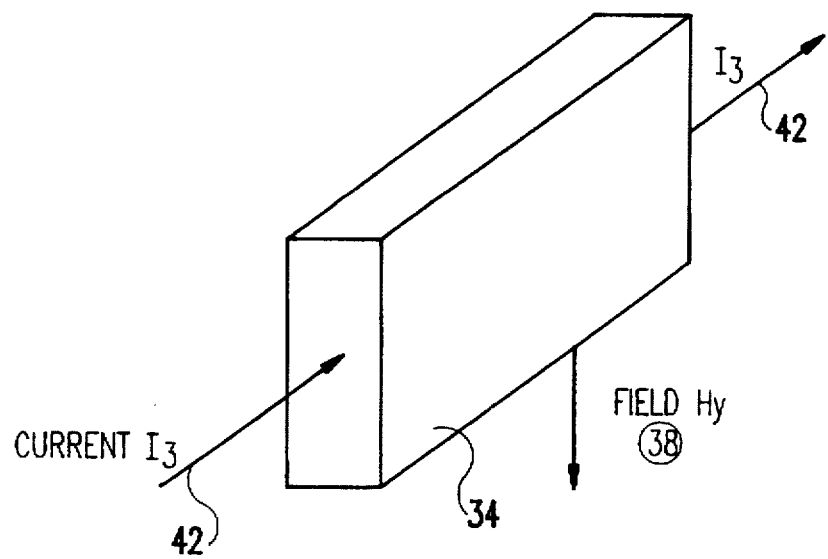

The drawing in FIG. 4B shows how data reading element 34 may be that of an alloy Iron-Nickel and how the resistance across the terminals changes in the presence of an electromagnetic field 38 when a current 42 is passed through its terminals.

Figure 5:
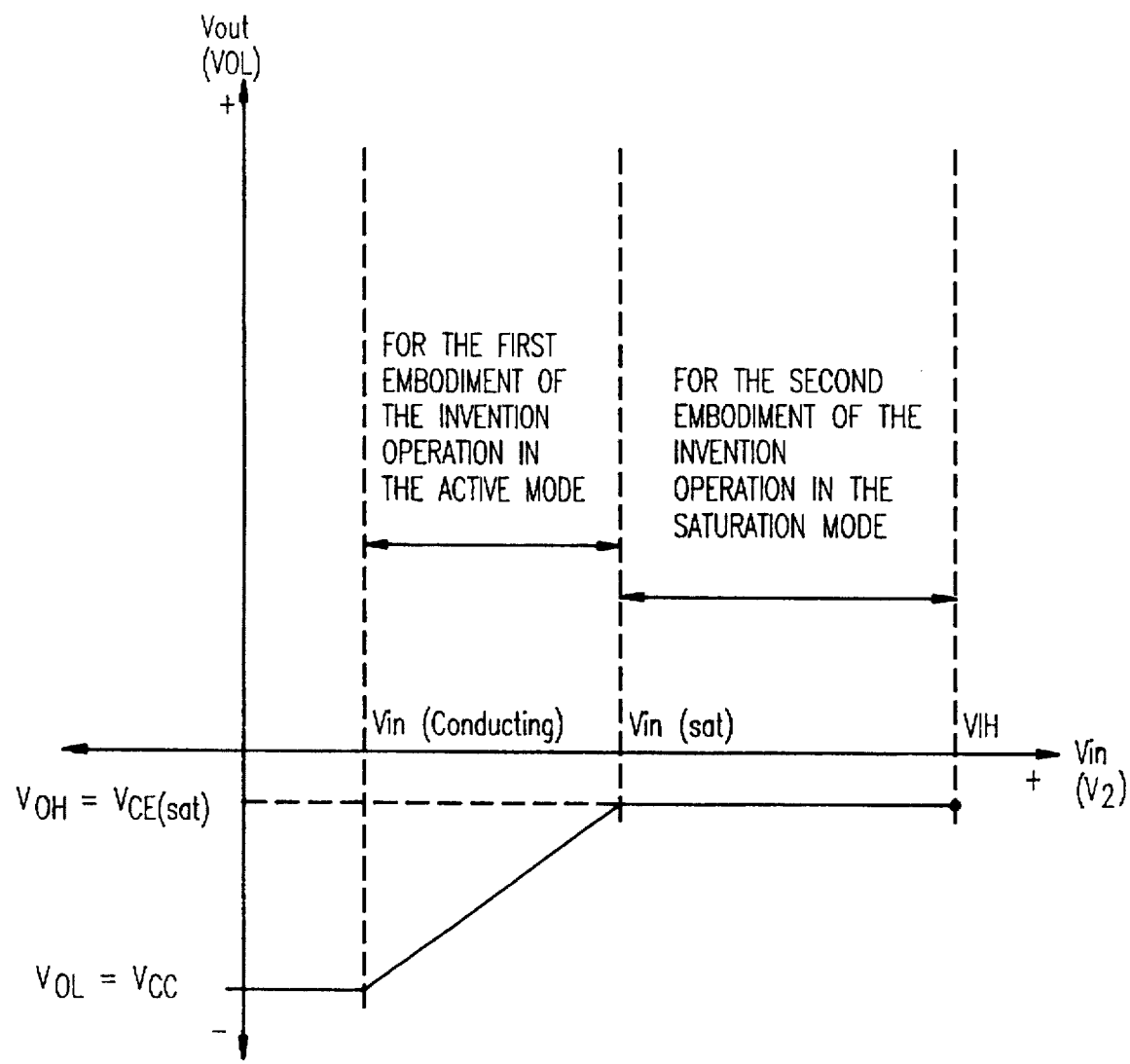

The drawing in FIG. 5 shows the voltage transfer characteristics of transistor M20 operating in the active mode for the data reading cycle in the first embodiment of this invention. Transistor M20 operates in the saturation mode in the second embodiment of this invention.

Figure 6:
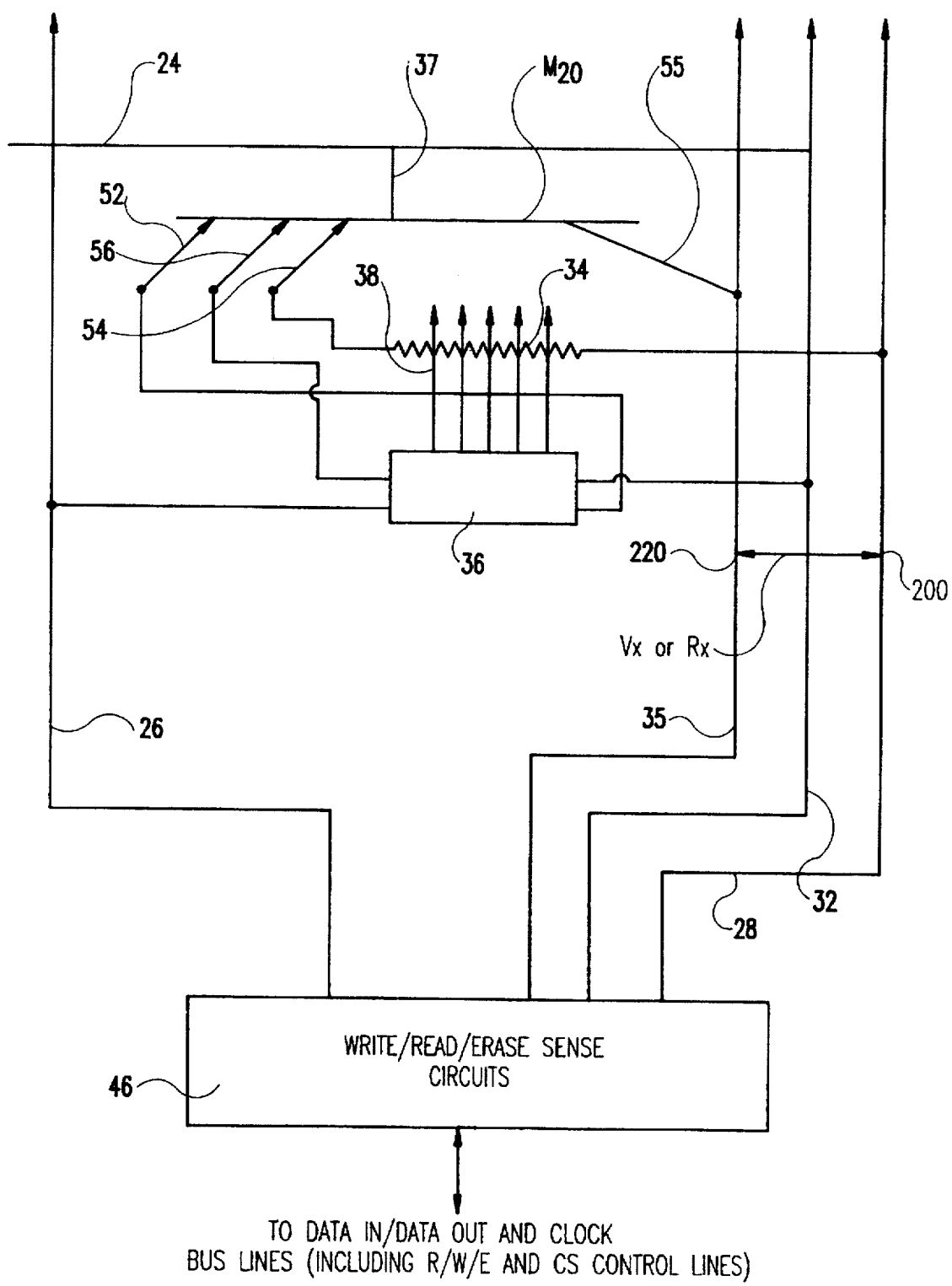

The drawing in FIG. 6 shows a schematic diagram of the one transistor static write and read and erase memory cell designed to store more than one bit of data at a time. Write and read and erase sense circuits 46 are connected between point 200 and point 220 during the data reading cycle so that they measure the voltage across a data reading circuit loop as will be explained in detail in the second embodiment of the invention. This can also be achieved by letting column write and read and erase sense circuits 46 read the output collector voltage at collector terminal 55.

The drawing in FIG. 7 shows what emitters of transistor M20 have a high, or are connected, or are on during the write cycle, the read cycle and the erase cycle, while all other emitters have either a low, or are disconnected, or are left open, or bare.

Figure 8:
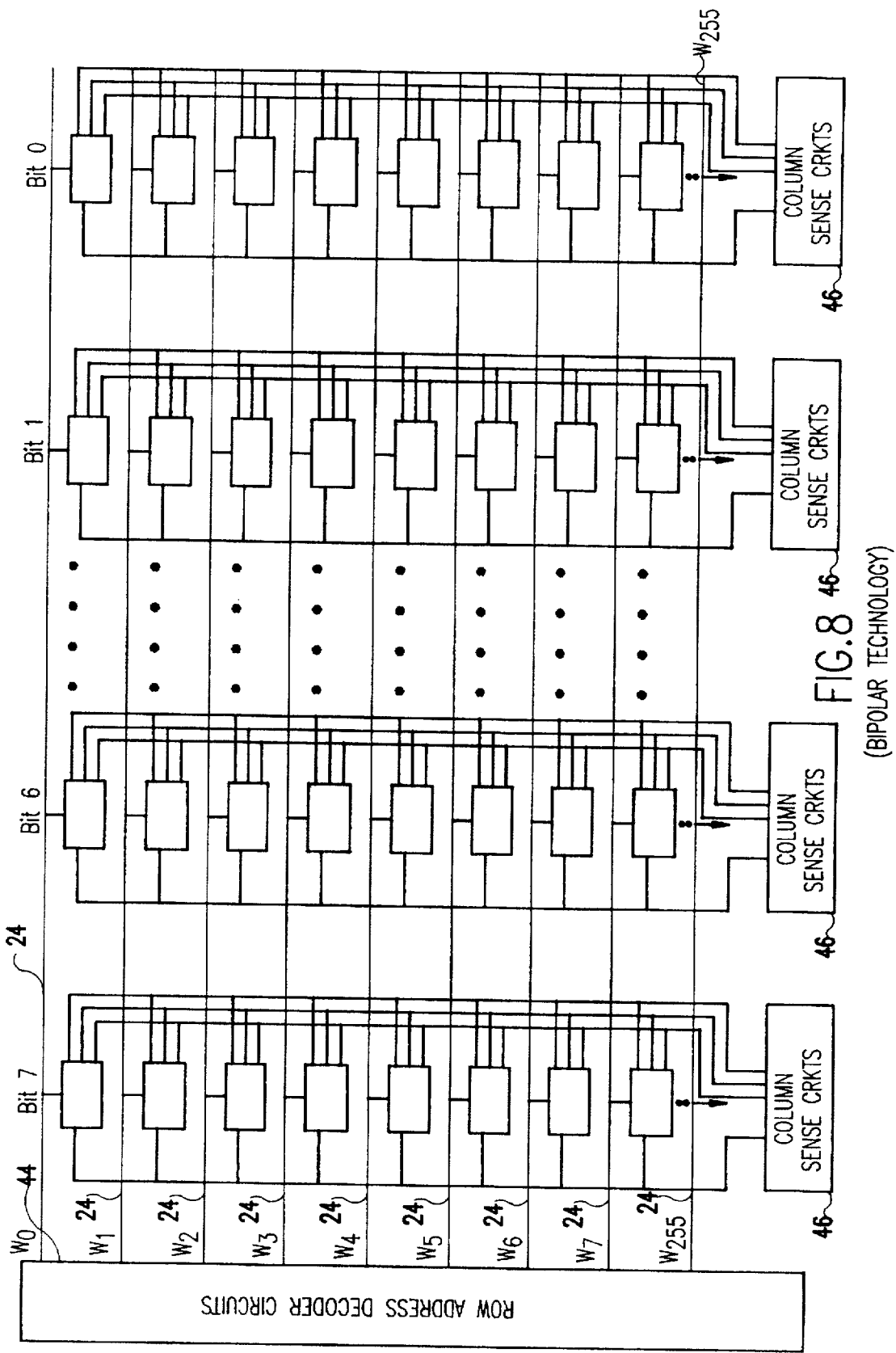

The drawing in FIG. 8 shows an 256×8 memory cell array of this invention as it may be fabricated on an integrated circuit semiconductor memory chip. The individual memory cells may either conform to the first embodiment (i.e. store only one bit at a time) or conform to the second embodiment (i.e. store more than one bit of a specified data type at a time). Both row address decoder 44 and column address sense circuits 46 are on the chip, although designs where row decoders and column address sense circuits are off the chip are also possible with no loss in function and purpose of this invention.

Figure 9:
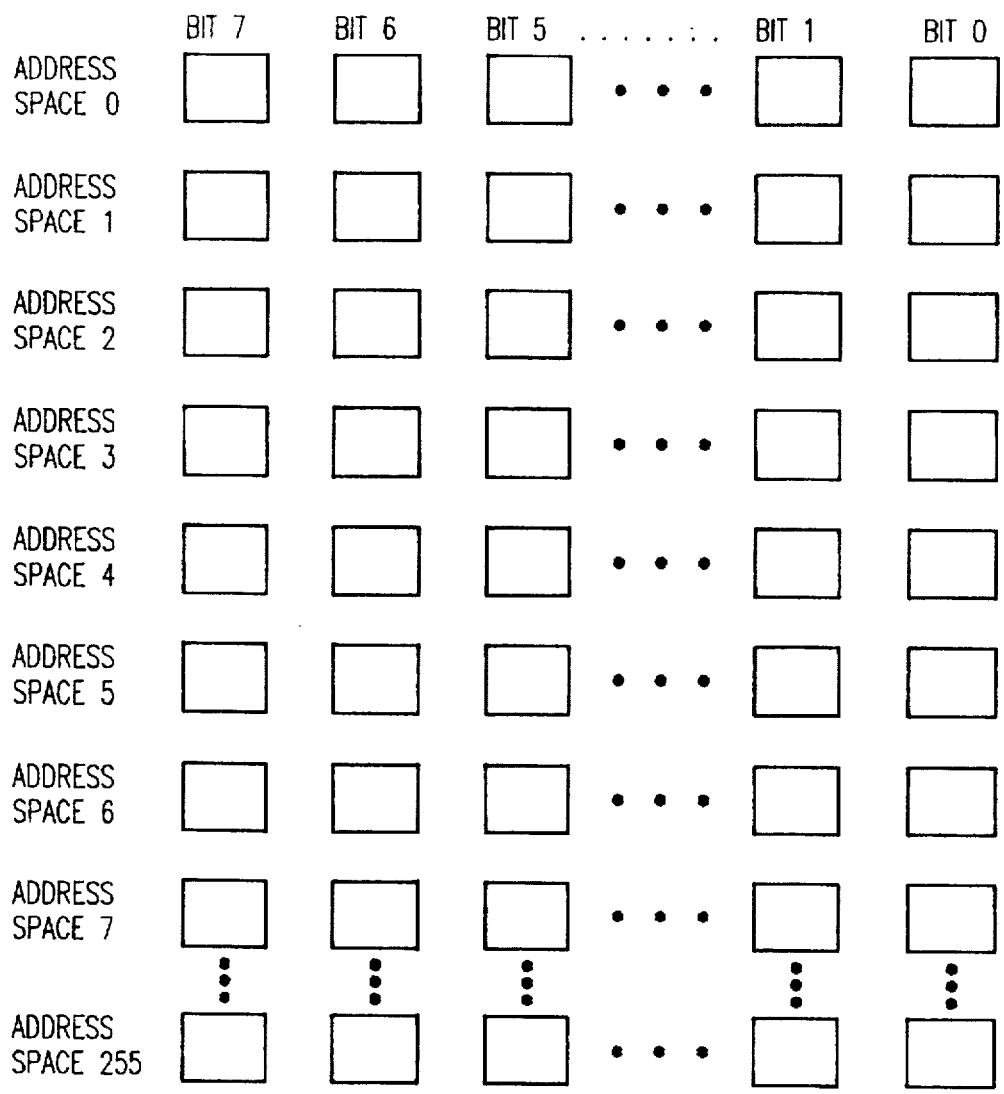

The drawing in FIG. 9 shows an 256×8 memory cell array of this invention in its second embodiment and two programs, Program 1 and Program 2, each with 8 instructions and with each instruction having a standard word length of 8 bits. Normally, the memory cell array would only store one of these programs. But, the second embodiment of this invention can, in fact, store both programs simultaneously because its memory cells are designed to store more than one bit of a specified data type at a time, as will be explained in the detailed description section of the second preferred embodiment.

The drawing in FIG. 10 is a truth table showing what emitters are on during the write cycle, the read cycle and the erase cycle and what emitters are disconnected, or are left open during these functional cycles.

Figure 11:
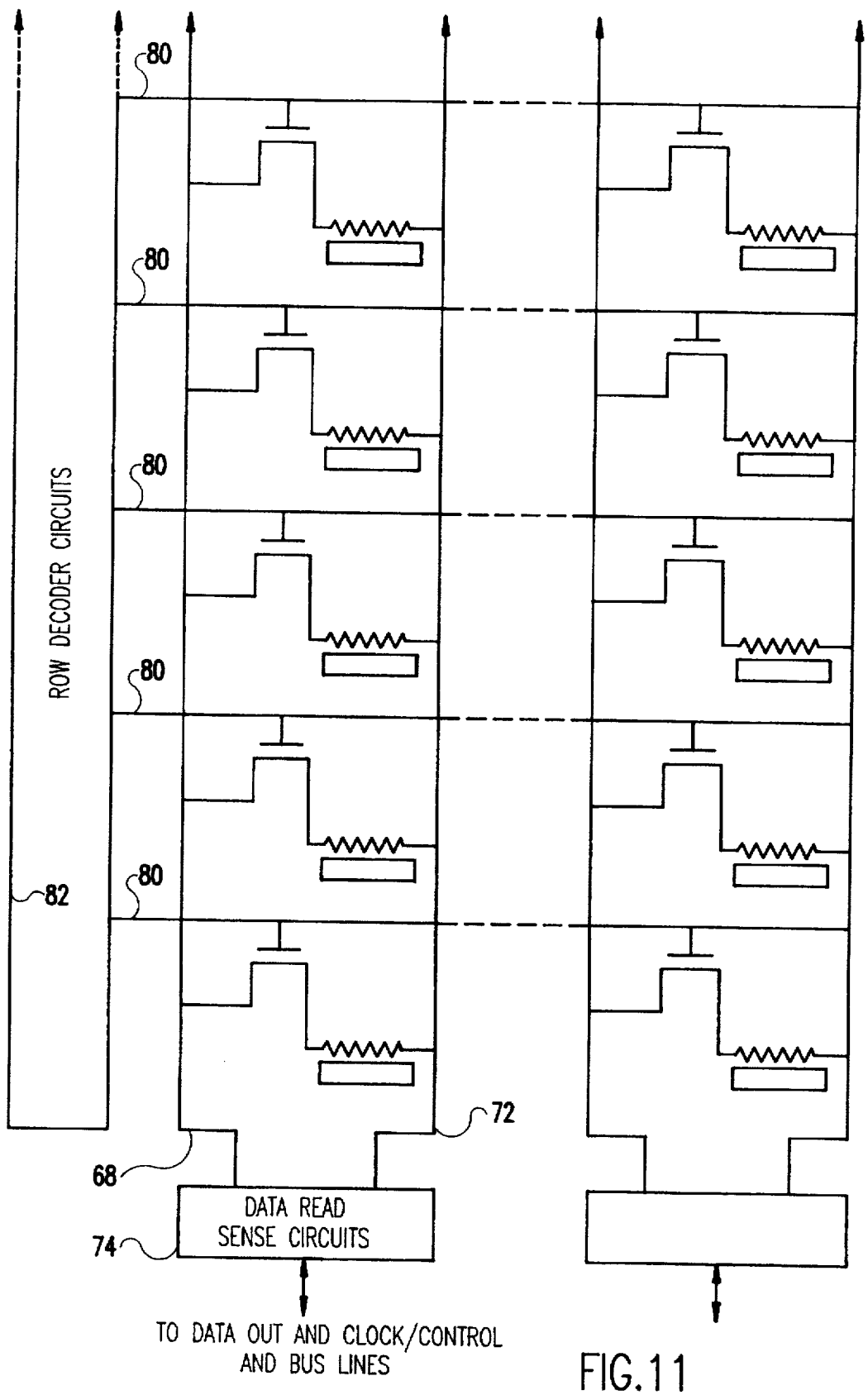

The drawing in FIG. 11 shows a memory cell array for the third embodiment of this invention (i.e. it's the read-only-memory format) based on the metal oxide semiconductor technology (MOS). Data read lines 68 and 72 are controlled by the data read sense circuits 74 and row address select lines 80 are controlled by the decoder circuit 82.

DETAILED DESCRIPTION OF THE PREFERRED EMBODIMENTS

Referring now to FIG. 3A, the first embodiment of this invention for an individual one transistor static write and read and erase memory cell is described. Multiemitter transistor M20 is switched on by now address select line 24 that is controlled and activated by a decoder circuit 44. Transistor M20 should have its three (3) emitter terminals 52, 54, and 56 as the inputs with the OR function of 1+0+0=1, and 0+1+0=1 and 0+0+1=1 with the condition that only one emitter is to have a high input at any one time during each cycle function such as the writing cycle, the data reading cycle or the data erasing cycle, while all other emitter inputs not involved in the function cycle underway at the time either have a low input or are left open or their signal input lines are disconnected from the signal supply within a write and read and erase sense circuit 46 of FIG. 3A. So, given that emitter 52 is used for writing data, emitter 54 is used for reading data and emitter 56 is used for erasing data, then a truth table as illustrated in FIG. 10 and repeated below shows the emitter inputs during each data function cycle:

| FUNCTIONS PERMITTED | E52 | E54 INPUTS | E56 | VO2 C55 OUTPUTS |
|---|---|---|---|---|
| WRITE CYCLE INPUT AND OUTPUT APPLY TO BOTH FIRST AND SECOND EMBODIMENTS | 1 (ON) | 0 OFF, LOW OR OPEN CRKT | 0 OFF LOW OR OPEN CRKT | =1 |
| READ CYCLE INPUT APPLIES TO BOTH FIRST & SECOND EMBODIMENTS. OUTPUT APPLIES TO FIRST EMBODIMENT ONLY | 0 OFF, LOW OR OPEN CIRCUIT | 1 (ON) | 0 OFF LOW OR OPEN CRKT | =1 HIGH FOR A ONE, LOW FOR ZERO |
| ERASE CYCLE INPUT AND OUTPUT APPLY TO BOTH FIRST AND SECOND EMBODIMENTS | 0 OFF, LOW OR OPEN CRKT | 0 OFF, LOW OR OPEN CIRCUIT | 1 ON | =1 |

Where only one of the three functions is permitted at any one time and where no two or three functions can be carried out by the write and read and erase circuits 46 simultaneously.

For a data write cycle function, the data write line 26 is activated by the write and read and erase sense circuits while all other data lines, that is data read line 28 and data erase line 32 are inactivated or disconnected from within the write and read and erase sense circuits 46. A data write voltage that is of a predetermined amount is applied to the data write line 26 and a corresponding data write current is made to flow through data write line 26 and passes through the electromagnetic element 36 in a given direction as shown in FIG. 3A, FIG. 4A, and FIG. 4B, so that it induces an amount of electromagnetism providing a corresponding amount of electromagnetic field 38 that represents one bit of data.

The data write current flows through data write line 26 that is connected to data write-input emitter terminal 52, and for a given data write voltage $V_1$ applied to the data write line 52 by the write and read and erase sense circuit 46, data write voltage $V_1$ acts as an input to data write input emitter terminal 52, giving an output voltage VO1 at the output stage. Similarly for the data write current $I_1$ provided at the data write input emitter terminal 52, a corresponding output current at collector terminal 55 is produced. Both voltage VO2 and the collector current are measured at the output stage by the write and read and erase sense circuit 46 via data line 35 for purposes of checking proper connecting and functioning of the data write circuit loop and the data write cycle, respectively.

The electromagnetism that produces the electromagnetic field 38 should be of an appropriate predetermined amount when made a function of the voltage $V_2$ across data reading element 34 to make the transistor M20 conducting, as will be explained in detail shortly. A predetermined amount of electromagnetism will represent a high (one) bit and another predetermined amount of electromagnetism will represent a low (zero) bit.

To read the data stored in the memory cell, data read line 28 has a predetermined read voltage applied to it by the write and read and erase sense circuit 46 of FIG. 3A. The read voltage produces a corresponding read current that flows through data read line 28 and through the terminals of data reading element 34 as shown in both FIG. 4A and FIG. 4B. Now, data reading element 34 is made up of the semiconductor material Indium Antimonide that changes the Voltage $V_2$ across its terminals in proportion to the electromagnetic field 38, Hx or Hy, when a data read current $I_2$ or $I_3$ is passed through its terminals.

One formula usually used to indicate the relationship between the voltage $V_2$ across data reading element 34 and the electromagnetic field Hx 38 is $V_2=(1/s) KI_2Hx_x$ where:

$V_2$=Voltage across the data reading element 34 as shown in 4A

K=Indium Antimondie material. Constant used.

Hx=Electromagnetic field 38 from electromagnet 36 as shown in FIG. 4A.

$I_2$=Data read current passing through Element 34 as shown in FIG. 4A.

S=Width of data read element 34 as shown in FIG. 4A.

Now, since for a given design S, K, and $I_2$ are constant, the voltage $V_2$ across data read element 34 is direction proportional to the electromagnetic field Hx 38. Hence the voltage $V_2$ read across data reading element 34 is proportional to the amount of magnetization that corresponds to the electromagnetic field Hx 38. In turn, the amount of magnetization is proportional to the type of bit either a high (one) or a low (zero) stored in the memory cell.

The voltage $V_2$ across data reading element 34 acts as a dependent input voltage to data read input emitter terminal 54. With reference to FIG. 5, when the dependent voltage $V_2$=Vin, at emitter terminal 54 is low, or just enough to make the transistor M20 conducting, a VO2=VOL output voltage about equal to Vcc, the supply voltage at the collector terminal is realized at the output stage, giving a low (zero) bit. As $V_2$=V increases, the input emitter current IE increases, causing the collector current IC to increase as well. In turn, the output voltage VO2 increases up to about VO2=VOH=VCE (sat). This represents a high (one) bit. However, for the kind of transistor used in this invention, VCE (sat) is negative so that the increase in output voltage is pointing in the direction of increasing positive y-axis as shown in FIG. 5 with the algebraic convention that the more negative (less positive) limit is designated as minimum.

Both VOH and VOL are measured by the column write and read and erase sense circuits 46 to determine the stored bit. Hence V-output high=VOH, V-output low=VOL and VOH=VCE (sat) and VOL=VCC, where VOH=VCE (sat) represent a high (one) bit and VOL=VCC represent a low (zero) bit. The output voltages for a high (one) bit and for a low (zero) bit may be reversed with no loss of function and purpose of this invention.

Alternatively, data reading element 34 may be that of an Iron-Nickel alloy that changes the resistance across its terminals in the presence of the electromagnetic field Hy, 38, as shown in FIG. 4B when a Current $I_2$, is made to flow through its terminals. The formula usually used to indicate the relationship between the resistance and the electromagnetic field Hy, 38, is $R_3=(\Delta R/\Delta R \text{ max})=1-(Hy/Ho)^2$ where the response of $\Delta R$ to Hy can be made linear by the introduction of an external bias field. Since according to Ohm's law, $V_3=I_3 R_3$ and $I_3$ is constant for a given design and situation, then $V_3$ the voltage across data reading element of FIG. 3A and FIG. 4B is proportional to the resistance $R_3$. The resistance $R_3$ is, in turn, proportional to the electromagnetic field Hy, 38, of FIG. 3A and FIG. 4B. The electromagnetic field Hy, 38, is in turn proportional to the type of bit of data stored as electromagnetism in the magnetic or electromagnetic element 36 of FIG. 3A, either a one (high) or a zero (low).

Hence for a given dependent input voltage $V_3$=Vin at data read input emitter terminal 54, a corresponding output voltage VO2 is realized at the output stage of this write and read and erase memory cell, as explained in the preceeding paragraphs according to FIG. 5.

Other designs such as using a type of coupled magnetic strips that also given a linear relationship between the resistance change $\Delta R$ and the electromagnetic field 38 when a data read current $I_3$ is passed through its terminals may also be used for the data reading element 34. In addition, other formulas that indicate the relationship between the voltages $V_2$ and $V_3$ and the electromagnetic field 38 may be used since they apply to slightly different compositions and sizes of the Indium Antimonide element 34 and the Iron-Nickel alloy element 34 used.

To erase data stored in the memory cell, data erase line 32 is activated by applying an appropriate voltage to it using the write and read and erase sense circuits 46 of FIG. 3A, while all other data lines are inactivated using the write and read and erase sense circuits 46. A corresponding current flows up data erase line 32 and passes through the electromagnetic element 36 in a direction opposite to that followed by the data write current in data-write line 26. A process of demagnetization of the electromagnetic element 36 is effected and hence data stored as electromagnetism or magnetism in the electromagnetic or magnetic element 36 is removed. Preferably prior to erasing the data stored in the memory cell, the data read cycle is initiated to determine the type of bit stored in the cell.

The voltage $V_2$=Vin has to be sufficient to make the transistor M20 conducting in the active region in relation to the collector voltage Vcc applied at the collector terminal 35 of transistor M20, and the ground reference voltage applied to the base terminal 37. In addition, any emitter, collector, and base resistances that may be necessary to be incorporated into the memory cell circuit to make transistor M20 produce the desired result for this particular one-bit storage memory cell embodiment are provided by the write and read and erase sense circuits 46 and the decoder circuit 44 of FIG. 3 and FIG. 8 respectively. This arrangement is necessary and convenient since the said emitter, collector and base resistances that may be needed are then not part of any one memory cell, but are shared by all the memory cells within the column for the emitter and collector resistance and by all the memory cells within the selected row for the base resistance. Hence the individual memory cell size and the area it occupies on an integrated circuit chip is considerably minimized by this sharing design.

The decoder circuits 44 of FIG. 8 have to keep all row lines 24 connecting to the base of transistor M20 in each cell to a voltage other than ground, before memory cell row selection, preferably below reference ground, so that the transistor is activated by the above mentioned decoder circuit 44 by bringing the transistor base terminal 37 to the ground reference voltage amount that is necessary to make the transistor M20 conducting when a voltage $V_2$=Vin is applied at the emitter terminal 54 of FIG. 3A. This explanation of the base terminal 37 of switching transistor M20 is specifically aimed at the type of transistor used in this invention. Other transistor configurations may be used with different operating steps, as long as they provide the same switching end result.

With regard to the first embodiment of this invention, the voltage Vin at the data input emitter terminal 54 can alternatively be a sum of two voltages, $V_R$, the voltage applied to the data read bit line 28 of FIG. 3A and the Voltage $V_2$ or Voltage $V_3$, the voltage across data reading element 34 of FIG. 3A, where Voltage $V_R$ is applied to bit line 28 by the column sense circuits 46. Hence Vin can alternatively be represented as Vin=$V_R+V_2$ or as Vin=$V_R+V_3$. It is the static memory cell designer's choice to use Vin=$V_2$ or to use Vin=$V_R+V_3$=$V_R+V_2$ to give a corresponding VOH=VCE (Sat) for a one (high) bit at the output terminal for one given value of $V_2$ or $V_3$, or to give a corresponding VOL=VCC for a zero (low) bit at the output terminal for another given value of $V_2$ or $V_3$.

Attention is now directed to both FIG. 5 and FIG. 6, where the second embodiment of this invention is illustrated and is explained in the following paragraphs.

In the second embodiment of this invention, the write and read and erase memory cell of FIG. 6 is designed to store both one and more than one bit of binary data of a specified type at any one time, the specified data type being either all bits stored in the memory cell all being ones (highs) or all bits to be stored in the given memory cell all being zeros (lows), but not a combination of both types of bits at any one time.

In order to write data in the memory cell of FIG. 6, a given memory cell is selected by applying an appropriate signal to the base terminal 37 of transistor M20. The column write and read and erase sense circuits 46 of FIG. 6 apply a predetermined voltage to data write line 26, and a predetermined write current flows into data write line 26 and through electromagnetic or magnetic element 36 so that the current induces a corresponding predetermined amount of electromagnetism or magnetism in the electromagnetic or magnetic element 36 of FIG. 6.

Once data is written in the cell, the data write current and the voltage provided by the sense circuits 46 are made input signals at data write input emitter terminal 52 where they produce a predetermined output current and output voltage at the collector terminal output stage of transistor M20. The column write and read and erase sense circuits 46 measure this data write out put voltage and output current to determine proper connectivity and proper functioning of the data write circuit loop.

For every additional binary bit of the same specified data types to be written or stored in the memory cell, row select line 24 is activated by the decoder circuits 44. Column write and read and erase sense circuits 46 apply a predetermined voltage to data write line 26, sending in turn a corresponding predetermined data write current flowing through data write line 26 and inducing a corresponding amount of electromagnetism or magnetism into data storage magnetic or electromagnetic element 36 that represents the total number of binary bits of the specified data type presently being stored in the memory cell, including the additional binary bit. The data write voltage and write current are then made input signals of data write input emitter terminal 52 where they produce corresponding data write output voltage and output current at the collector terminal 55 of FIG. 6 where they are measured by the column write and read and erase sense circuits 46 of FIG. 6 to determine proper data write circuit loop connectivity and functioning.

To read the data stored in the one transistor static write and read and erase memory cell of FIG. 6, decoder circuit 44 of FIG. 8 activates row select line 24 of FIG. 6 by applying a predetermined appropriate voltage to row select line 24. The column write and read and erase sense circuits 46 of FIG. 6 apply a predetermined data read voltage to data read line 28, thereby sending a corresponding predetermined data read current flowing through data read line 28 and into data reading element 34 of FIG. 6.

As already explained in the first embodiment of this invention, data reading element 34 is made up of a material that changes the voltage across the terminal when a current is passed through its terminals in the presence of an electromagnetic or magnetic field as shown in FIG. 4A, such an element as that of the semiconductor material Indium Antimonide or an element that changes the resistance across its terminals when a current is made to flow through its body in the presence of an electromagnetic field or a magnetic field as shown in FIG. 4B, such an element as that of the alloy of Iron-Nickel.

Now as the data read current passes through data reading element 34, the voltage across the data reading element 34 changes in proportion to the magnetic or electromagnetic field 38 crossing its body in a given direction, (hx) for FIG. 4A or (Hy) for FIG. 4B. The strength of the magnetic or electromagnetic field Hx or Hy is in turn dependent on the amount of electromagnetism or magnetism induced by the data write current in electromagnetic or magnetic storage element 36. In turn, the total amount of electromagnetism or magnetism in magnetic storage element 36 is directly proportional to the number of binary bits of a specified type written in the memory cell by the column write and read and erase sense circuits 46 of FIG. 6.

Hence, the voltage $V_2$ read across data reading element 34 is in turn directly proportional to the amount of data in total binary bits of a specified type stored in the memory cell at that time.

Voltage $V_2$ is then by itself or when added to the data read voltage applied to the data read line 28 by the write and read and erase sense circuits 46, made a dependent input voltage Vin at data read input emitter terminal 54 of FIG. 6.

As already explained during the data write cycle of the second embodiment of this invention, voltage $V_2$ by itself or when added to the data read voltage applied to the data read line 28 of FIG. 6 by the write and read and erase sense circuits 46 whether representing one or more than one bit of data of the specified data type should be of a sufficient amount to make the transistor M20 enter the saturation mode immediately.

Hence Vin is made an input voltage at data read input emitter terminal 54, and sends transistor M20 into saturation making the voltage VCE between the input emitter terminal 54 and the collector terminal 55 constant or fixed. Thus for the second embodiment of this invention, VCE=VCE (sat) and is constant or fixed regardless of how big the Vin amount is, as long as the memory cell has any data stored therein.

Looking at FIG. 6, the column write and read and erase sense circuits 46 now measure the Voltage Vx across the data reading circuit loop. From FIG. 6,
Vx=Vin+VCE (sat)
But Vin=Vin (sat)+Vdata Hence Vx=Vin (sat)+V(data)+VCE (sat) where:
Vx=total voltage read by the write and read and erase sense circuit 46 across the data reading circuit loop.
Vin (sat)=Input voltage necessary to make the transistor operate in the saturation mode.
V(data)=Voltage across data reading element 34 that represents the actual amount of data in binary bits stored as electromagnetism or magnetism in the memory cell.
VCE(sat)=The voltage between data read input emitter terminal 54 and data output collector terminal 55.

Now Vin(sat) is constant and known for a given switching transistor M20 used. Also VCE(sat) is constant and known for a given switching transistor design M20 used. Hence Vx is directly proportional to V(data). By measuring Vx and subtracting both Vin(sat) and VCE(sat) from Vx, we can obtain V(data) the voltage that represents the actual amount of data in total binary bits stored in the memory cell at any one time.

Specifically, each bit of binary data of the specified type such as a one (high) or a zero (low) is allocated a uniform representative voltage. For example, a one (high) binary bit is allocated a representation voltage of one millivolt (1 mv). The amount of the uniform representative voltage to represent a unit bit of the specified data type depends on the actual size of the electromagnetic or magnetic element 36, the amount of electromagnetism and the corresponding electromagnetic or magnetic field 38, the selected size and magnetic or electromagnetic nature of the magnetic element 36, the size and sensitivity of the data reading element 34 regarding the amount of electromagnetic field 38 that can influence the voltage across its terminals and the amount of data reading current used, and how sensitive the column write and read and erase sense circuits 46 are in measuring small, incremental voltages across the data reading element 34 and hence across the data reading circuit loop, between point 200 and point 220 as shown in FIG. 6.

Preferably, the switching transistor M20 used, the column write and read and erase sense circuit 46, the data reading element 34, and the electromagnetic or magnetic data storage element 36, should all have individual component parameters that facilitate the measuring of the small voltages across data reading element 34, V(data), that has a representative voltage with bit unit increments that fall within the range of a minimum of microvolts per each bit unit (or per each one bit of data of a specified type) to a suggested maximum of millivolts per each bit unit in order to take complete advantage of all of the memory cell data storage capabilities.

However, this suggested preferred range of a unit bit representation voltage is not binding. Other ranges may be used depending on the design component parameters used, especially with regard to the magnetic element 36 and element 34.

For illustration purposes, and with transistor M20 in saturation, if: Vx=5 volts,
VCE(sat)=−0.1 volts,
Vin (sat)=+0.1 volts,
and since Vx=Vin(sat)+V(data)+VCE(sat) then V(data)= Vx−Vin(sat)−VCE (sat), and V(data)=5−0.1−(−0.1)=5 volts. Also Vx=Vc, where Vc is the collector terminal 55 voltage. So V(data) can alternatively be measured by simply measuring the collector terminal voltage Vc using the column write and read and erase sense circuit 46, then subtracting both Vin(sat) and VCE(sat) from the measured valued of Vc.

To obtain the total number of binary bits of a specified type stored in such a memory cell, you divide the total data representation voltage read across the data circuit loop, V(data) by the unit bit representative voltage predetermined to represent one individual bit unit, which in this case may be given as 1 millivolts. So 5 volts divided by 1 millivolt gives 5000 bits total of a specified data type, either all one (high) bit or all zero (low) bits but not a combination of both types of bits in one cell, at that time.

Once the total number and type of bits stored in a given memory cell is measured and determined as explained in the preceding paragraph, a copy of one bit of that number of bits in the memory cell is sent along the data bus, say, to a buffer register or a microprocessor register where it may be needed for use in calculations.

The same representative voltage to represent a unit bit for a one (high), may be used to represent a unit bit for a zero (low). Alternatively, both a unit bit for a one (high) and a unit bit for a zero (low) may be represented by different voltage amounts.

The column write and read and erase sense circuit 46 of FIG. 3A, FIG. 6, and FIG. 8 also have control lines R/W/E and CS where R/W/E is the control line on which the write, read and erase input signals are applied to specify required operation cycle, whereas CS (chip select) is needed to select a given chip in a multichip memory system.

In addition, the column write and read and erase sense circuits 46 of FIG. 3A, FIG. 6 and FIG. 8 contain a current and voltage measuring and amplification circuits, as well as any needed collector and emitter terminal resistances to increase all necessary data output voltages and currents, to bring all measured signals to the desired levels, and to provide proper functioning of the memory cell circuit so that the desired memory S cycles are carried out. As explained already in the first embodiment of this invention, this preferred design of having any needed emitter and collector resistances provided by the column write and read and erase sense circuits 46 is necessary and convenient since these resistor components are not part of individual memory cells, but are shared by all the memory cells within the column, thereby reducing the area a single memory cell occupies on an integrated circuit chip.

To erase data written in the one transistor static write and read and erase memory cell of FIG. 6, the memory cell is selected by applying an appropriate voltage to row select line 24 using decoder circuits 44. A data erase voltage is applied to data erase line 32 by the column write and read and erase sense circuit 46. A corresponding predetermined amount of current flows through data erase line 32 and into the data storage magnetic or electromagnetic element 36, but in a direction opposite to the direction of current flow of the data write current explained in the data write cycle. In so doing a process of demagnetization takes place and hence the data written or stored as magnetization in electromagnetic or magnetic element 36 is removed or erased.

The data erase current mentioned in the preceeding paragraph is sent through data storage element 36 in Predetermined amounts that represent a given total number of binary bits of data of the specified type and is equal to the data write current used to magnetize the magnetic or electromagnetic storage element 36. Hence, it is possible to erase a given number of bits of data at a time by reducing the magnetization in magnetic data storage element 36, a given number of bits at a time, much as it is possible to write or store a given number of bits of data at a time in the magnetic data storage element 36 by increasing the magnetization in the element 36 by an amount of magnetization that represents a total number of binary bits of the specified data type presently being stored in the memory cell, including the additional binary bit. In some designs, it may preferably be necessary to read the data stored in the cell prior to erasing it, so that the erase circuits within the column write and read and erase sense circuit 46 know exactly how many bits of data are stored in the memory cell before the erasing cycle goes under way. This is necessarily convenient in those memory designs where data write cycle time, data read cycle time and data erase cycle time are not of critical importance.

The third embodiment of this invention is now described and attention is directed to FIG. 3B1 and FIG. 3B2. The third embodiment describes a one transistor read only memory cell (ROM) whose data is written or stored in the memory cell at the time of manufacture of the memory cell and read repeatedly by the digital system of which the memory cell of the third embodiment is an integral part.

The ROM cell may either use the Bipolar switching transistor technology illustrated in FIG. 3B1 or the MOS Switching transistor technology shown in FIG. 3B2.

Regardless of what switching transistor technology is used, for a ROM cell designed to store one bit of data per memory cell, data is written or stored in the cell as explained in the data write cycle of the first embodiment, except that this is done at the time of manufacture of the ROM cell. In addition, switching transistor M21 in FIG. 3B1 is different than switching transistor M20 in FIG. 3A because it has only one emitter. The switching transistor M21 of FIG. 3B1 may have its collector terminal 55 act as the input terminal and its emitter terminal 54 act as the output terminal with no change in results. An external data writing circuit is used to write data in the cell at the time of manufacture. Data is read from the ROM cell as described in the first embodiment of this invention.

With regard to the ROM cell designed to store more than one bit of data of a specified type at any one time, data is written or stored in the magnetic or electromagnetic elemente 36 of FIG. 3B1 as explained in the second embodiment of this invention, but at the time of manufacture of the ROM cell. For the data writing cycle at the time of manufacture, an external data writing circuit may be used instead of a column write and read and erase sense circuit 46 as explained in the second embodiment.

Data is read from the ROM cell of FIG. 3B1 as explained in the second embodiment of this invention where the read sense circuits 46 of FIG. 3B1 contain a voltage measuring circuit that measures the voltage across data reading circuit loop Vx, where Vx=Vin+VEC(sat)

and Vin=Vin(sat)+V(data)

Hence Vx=Vin(sat)+V(data)+VEC(sat) and Vx is the voltage between point 200 and point 220 in FIG. 3B1 where both points define the data reading circuit loop of the memory cell.

The read V(data) is then divided by the pre-determined voltage amount allocated to represent one bit of data of a specified type to obtain the total number of bits of the specified data type stored in the ROM cell, as already explained in the data reading cycle function of the second embodiment of the invention.

With regard to this third embodiment when using MOS (metal-oxide semiconductor) technology, when the ROM cell of FIG. 3B2 is designed to store either one bit of data or more than one bit of data at a time, the data read sense circuit 74 of FIG. 3B2 measures the Voltage Vz between point 400(x) and point 600 (y) as shown where $Vz=V_T+V$ (data) where $V_T$=any voltage drops across transistor M21

V(data)=the voltage across data reading element 34.

Now $V_T$ is known for the gate voltage applied to switch on the transistor. Hence by measuring Vz, the voltage across the data reading circuit loop, one can determine V(data).

Once V(data) is determined by the data read sense circuits 74 of FIG. 3B2, then the total number of binary bits of a specified type stored or written in the ROM cell are found by dividing V(data) by the predetermined voltage amount allocated to represent one bit of data of the specified binary type. A copy of one bit is then gated onto the data bus to where it is transferred for use by other circuits such as a microprocessor for a specified function.

When designed to to hold more than one binary bit of data of a specified type as explained in the second embodiment of this invention, it becomes necessary to organize the data in a way that makes it easy and faster for the write and read and erase sense circuit 46 of FIG. 6 to access the memory cell for reading data, for writing data or for erasing data. Attention is now directed to FIG. 8 in which figure a 256×8 one transistor static write and read and erase memory cell array is shown. Generally, to store a word length of data in a memory cell array, it is necessary to specify the exact number of binary bits (give a standard word length) that each word of data to be stored in the array will have (8 bits in case of FIG. 8). For a standard word length of n bits, then $2^n$ unique individual address (address spaces) are specified with each unique address space (1 to $2^n$) designed to store a unique word and with each unique address space capable of storing one and more than one such unique word up to a predetermined maximum number of words that depends on the maximum number of binary bits of a specified data type each memory cell within the unique address space can store, at a given time.

If n for example is equal to 8 as shown in FIG. 8, then the standard word length is 8-bits per work and $2^n$ is equal to 256 unique individual addresses as total address space capacity of the memory cell array. Also since each address space is allocated a unique 8-bit word to store, it follows that each memory cell comprising the specified unique address space is allocated to store only one type of binary bit, either a one (high) bit type or a zero (low) bit type, but not a combination of both bit types in one memory cell at the same time.

If each memory cell within the address space is designed to store 5000 bits of data, an example already used in the preceding paragraphs where the second embodiment of this invention was explained, then each of the 256 address spaces within the memory cell array can store a maximum of 5000 words at a given time with each word having a standard word length of 8-bits.

Hence address space $W_1$ may store 5000 words maximum of 8-bits each, with the unique bit arrangement 00000000. Address space $W_2$ in FIG. 8 may store 5000 words maximum of 8-bits each, with the unique bit arrangement 00000001. Address space $W_3$ in FIG. 8 may store 5000 words maximum of 8-bits each, with the unique bit arrangement 00000010. Address space $W_4$ in FIG. 8 may store 5000 words maximum of 8-bits each, with the unique bit arrangement 00000011 and so on, and finally, address space $W_{256}$ in FIG. 8 may store 5000 words maximum of 8-bits each with the unique bit arrangement 11111111. The addresses between $W_4$ and $W_{256}$ have been omitted because of space considerations in writing this description, but they follow the same pattern of storing all the unique words of data between 00000011 and 11111111. For example, address space 254 stores the unique word 11111101 and address space 255 stores the unique word 11111110.

As a further illustration of the second embodiment of this invention, attention is further directed to FIG. 9. A memory cell array comprising 256 rows and 8 columns of individual memory cells capable of storing one or more bits of binary data is shown. Also shown in FIG. 9 are two short programs, Program 1 and Program 2, in a given machine language code, with each program having eight instructions and with each instruction having a standard word length of 8-bits. The eight memory cells in address space 0 are designed to store the word 00000000. Address space one is designed to store the word 00000001 address space two is designed to store the word 00000010. Address space three is designed to store the word 00000011 and so on and finally address space seven is designed to store the word 00000111. The rest of the address spaces from address space eight to address space two hundred and fifty-five are left empty, or may be allocated for some other data. Hence, the instructions of Program 1 and Program 2 will be stored in the memory cell array as follows:

Address space B will store instruction A of Program One and instruction N of Program Two. Address space 1 will store instruction B of Program One and instruction K of Program Two. Address space two will store instruction C of Program One and instruction I of Program Two. Address space 3 will store instruction D of Program One and instruction L of Program Two. Address space 4 will store instruction E of Program One and instruction O of Program Two. Address space 5 will store instruction I of Program One and instruction M of Program Two. Address space 6 will store instruction G of Program One and instruction P of Program Two and Address Space I will store instruction H of Program One and instruction J of program Two.

With regard to reading a word of data stored in the memory cell array such as that of FIG. 8, this is done as explained earlier in the second embodiment of this invention by reading the total number of bits stored in each memory cell of the address space selected, taking a copy of one such read bit from every memory cell within the address space and gating it onto the data bus of the digital system of which the memory array is a part, using the column write and read and erase sense circuits 46 of FIG. 6, where the one bit of data copied from each memory cell is sent to another part of the digital system such as a microprocessor where the word of data may be required.

If the individual memory cells of FIG. 9 were designed to store only one bit of data per memory cell, then the address space between address space 0 and address space 7 would only have the storage capacity for only one program, either Program 1 or Program 2, but not both Program 1 and Program 2 at the same time.

However, because these memory cells of address space 0 to address space 7 can store more than one bit of data of a specified data type at the same time, both Program 1 and Program 2 can easily be stored in the available address space, with lots more room for more data, depending on the maximum number of binary bits that each memory cell can store simultaneously.

The invention is now fully described in its three embodiments. Slight variations in the three embodiments described are possible. For example, a different switching transistor structure that gives different voltage input and voltage output characteristics from those described in the first embodiment and illustrated in FIG. 5 may be used instead of transistor M20.

In addition, the data reading element 34 of FIG. 3A and FIG. 6 may be any other element that either changes the voltage or resistance across its terminals when a current is passes through it in proportion to a magnetic or electromagnetic field crossing its body in a given direction. Such an element as 34 of FIG. 3A may replace either the suggested Indium Antimonide Semiconductor or the Iron-Nickel alloy, or the coupled magnetic strips. In addition, some data reading element 34 need more than two terminals connected to the data reading element 34 in order to form a data reading circuit loop in the memory cell of FIG. 3A, FIG. 3B1, FIG. 3B2 and FIG. 6. Hence, an additional signal line means that connects each additional terminal of data reading element 34 to the write and read and eraze sence circuit 46 has to be added preferably to the left of the memory cells of FIG. 3A, FIG. 3B1, FIG. 3B2 and FIG. 6 as appropriate.

Further still, the number of binary bits each memory cell can store with regard to the second embodiment of the invention depends on the design used and is limited by such factors as the size and sensitivity of the element used in data reading element 34 of FIG. 6, the level and size of writing, reading and erasing signals the desired design can accommodate, the voltages, currents and resistance ranges that circuit components can accommodate, the nature of the data storage magnetic or electromagnetic element 36 used, and the sensitivity or voltage range that the column write and read and erase sense circuits 46 have.

However, as can be observed by the reader who is well knowledgeable in this art, the invention provides a better alternative to the static read and write memory cells of FIG. 1A and FIG. 1B for the EPROM and both the NMOS and PMOS static-RAM technology cells shown in FIG. 2A and FIG. 2B, where one memory cell has a minimum of six transistors as compared to one transistor for this invention. Chip area is saved by using this invention.

Since the data storage element of this invention is of magnetic material, it is easy to incorporate into every memory cell, as easy as the metal wires carrying the signals are easily etched on to a chip.

When compared to current 16-megabit, 64-megabit, and 256 megabit DRAM memory chips, this invention offers a better alternative in its first and its second embodiment to the said DRAM chips in several ways.

First, it is a permanently static write and read and erase memory whereas the DRAM cells are dynamic as the name indicates. Hence the invention can work as SRAM, RAM and ROM and also as EPROM for all digital systems in its first embodiment, and data stored in the main memory of such a digital system does not have to be downloaded to a peripheral storage system such as a magnetic disk or a magnetic tape when the digital system is being switched off.

Second, in its second embodiment, the invention, in addition to the advantages described above, has far much more data storage capacity per memory cell than current DRAM (dynamic RAM) memories.

A 16-megacell DRAM chip has exactly 16,777,216 memory cells and stores exactly 16,777,216 bits of data or 2,097,152 bytes of data per chip. In comparison, a 16-megacell memory chip of the invention in the second embodiment has exactly 16,777,216 cells, but stores 16,777,216×5000 or $8.388608 \times 10^{10}$ bits or $1.048576 \times 10^{10}$ bytes or 10.48576 gigabytes of data when each such memory cell stores a maximum of 5000 bits of data of a specified types as explained in the preceding paragraphs, where the number 5000 is given here as an example and it depends on the memory cell design parameters used.

Third, in its first, its second and third embodiments, the invention can be built into memory cartridge format or memory card format and used as: (a) blank memory cartridges and blank memory cards in it first and second embodiments and these erasable memory cartridges and memory cards used to record on data in such situations where digital systems require to conserve the electrical energy now wasted in magnetic disk and magnetic tape drives. Such digital systems include portable laptop computers and personal digital assistants (PDAs). In comparison, current DRAM memories are not used in memory cartridges and memory cards because they require a constant power supply to keep the data stored.

(b) in its second embodiment, the invention can be built into prerecorded memory cartridges and memory cards for video and audio players and such recorded data is played on specially made video and audio players with no moving motor parts, further conserving the energy used in current video and audio players that use magnetic tape and magnetic and laser disk drives.

(c) in its third embodiment the invention can be built into ROM cartridges and ROM memory cards for use in a wide variety of digital systems, whereby the ROM cartridges and ROM memory cards contain pre-prepared software packages. This arrangement comes in handy when long software programs that need very large storage space are needed to be repeatedly used and have therefore to be incorporated into the main permanent memory of such digital systems. All this arrangement is made possible by this invention because of its vast data storage capacity, unlike current static RAM (SRAM), ROM and DRAM.

Fourth, the invention in both its second and third embodiments saves electrical energy when compared to both 6—T static RAM and peripheral data storage devices such as magnetic tapes, and disk drives as well as optical disk drives. For example, a 16-mega cell integrated circuit chip of this invention stores 10.48576 gigabytes, about the same as the latest double sided CD-ROM technology does when one cell is designated to store 5000 bits of data as explained earlier in this description. Better still, this invention is an on-board main memory whereas the memory drives are peripherals requiring large amounts of energy and time to run the motor mechanisms that drive them, when storing and accessing data from them.

Fifth, this memory cell invention has shorter data write and data read cycle times than existing 6-Transistor static RAM because the individual memory cells are smaller than 6—T SRAM cells and hence data signals have a shorter distance to travel for every bit written or read.

Sixth, when compared to current static 6—T RAM memory cells, this invention saves energy because whereas 6—T RAM needs a constant DC voltage supply to keep the data written in the flip-flop memory cell, this invention needs no constant power supply to keep the data stored in the memory cell. Data can remain stored in the memory cell of the invention as electromagnetic energy even when the power supply to the memory cell is switched off.

The invention should, therefore, not be limited to the embodiments described; rather, its scope should be determined by the appended claims and their legal equivalents.

What I claim is:

1. An improved one transistor static write and read and erase memory cell for storing in data until erased, comprising:

(a) a switching transistor means for switching on said one transistor static write and read and erase memory cell;

(b) a row select line means whose first end is connected to a decoder circuit means and whose second end is connected to a base terminal of said switching transistor for applying thereon a predetermined amount of voltage so as to select said one transistor static write and read and erase memory cell;

(c) an electromagnetic or magnetic element for storing therein binary data in the form of electromagnetism or magnetism;

(d) a data write bit line means for applying thereon a predetermined data write voltage, said data write voltage causing a corresponding predetermined data write current to flow through said data write bit line means and into said electromagnetic or magnetic element means connected to said data write bit line in such a way that said data write current induces a predetermined amount of electromagnetism or magnetism in said electromagnetic or magnetic element means, said predetermined amount of electromagnetism or magnetism representing a specified number of bits of binary data of a specified binary type said specified type being either a one binary type data or a zero binary type data;

(e) a data erase bit line means for applying thereon a predetermined amount of data erase voltage, said data erase voltage causing a corresponding predetermined amount of data erase current to flow through said data erase bit line means and into said electromagnetic or magnetic element means connected to said data erase bit line means, whereby said data erase current flows through said electromagnetic or magnetic element means in a direction opposite to the direction of flow of said data write current so as to effect a process of demagnetization of said predetermined amount of electromagnetism or magnetism induced in said electromagnetic or magnetic element by said data write current;

(f) a data read bit line means on which a data read current is sent;

(g) a data reading element means of an appropriate material whose two terminals are connected to said data read bit line means said data reading element means having a property of varying the voltage across said two terminals when said data read current is made to flow through said two terminals of said data reading element means in the presence of an electromagnetic or magnetic field pointing in a specified direction, said electromagnetic or magnetic field being generated by said predetermined amount of electromagnetism or magnetism induced in said electromagnetic or magnetic element means by said data write current;

(h) an output voltage and output current bit line means connected to a collector terminal of said switching transistor means for channeling a collector current during the writing, reading and erasing cycles of said one transistor static write and read and erase memory cell and for providing an output voltage and a collector current connection to a column write and read and erase sense circuit.

2. The switching transistor means of claim 1 wherein a first input emitter terminal is connected to a first end of said data write bit line.

3. The switching transistor means of claim 1 wherein a second input emitter terminal is connected to a first end of said data read bit line means.

4. The switching transistor means of claim 1 wherein a third input emitter terminal is connected to a first end of said data erase bit line means.

5. The data write bit line means of claim 1 wherein a second end of said data write bit line is connected to a column write and read and erase sense circuit means.

6. The data read bit line means of claim 1 wherein a second end of said data read bit line means is connected to a column write and read and erase sense circuit means.

7. The data erase bit line means of claim 1 wherein a second end of said data erase bit line means is connected to a column write and read and erase sense circuit means.

8. The switching transistor means of claim 1 wherein said switching transistor means performs an OR logic function in the sense that only one of said input emitter terminals of said switching transistor means has a high input voltage signal during a data cycle function, said input emitter terminal with said high input voltage signal carrying an input voltage signal and an input current signal of a specified data cycle function underway at a given item and other remaining input emitter terminals having a low input voltage or have the input supply voltage disconnected from within said column write and read and erase sense circuit means.

9. The column write and read and erase sense circuit means mentioned in claim 1 further comprising a data reading subcircuit for measuring either a voltage across said data reading element or a resistance across said data reading element and wherein said column write and read and erase sense circuit is used for providing said predetermined data write voltage and said corresponding predetermined data write current, said predetermined data read voltage and said corresponding predetermined data read current and said predetermined data erase voltage and said corresponding predetermined data erase current.

10. The data reading element means of claim 1 wherein said data reading element means is made up of an indium antimonide semiconductor material that has a property of varying a voltage across both terminals of said data reading element means in proportion to said electromagnetic or magnetic field crossing said data reading element means in a specified direction when said data read current is made to flow through the terminals of said data reading element means.

11. The data reading element means of claim 1 wherein said data reading element means is made of an iron and nickel alloy that has a property of varying an electrical resistance between both terminals of said data reading element means in proportion to said electromagnetic or magnetic field crossing said data reading element means in a specified direction when said data read current is made to flow through the terminals of said data reading element means.

12. The data reading element means of claim 1 wherein said data reading element means is made of a material, said material having a property of varying an electrical resistance between both terminals of said data reading element means in proportion to an electromagnetic or magnetic field strength crossing said data reading element means in a specified direction when said data read current is made to flow through the terminals of said data reading element means.

13. The one transistor static write and read and erase memory cell of claim 1 wherein said electromagnetic or magnetic element means for storing in data is capable of being electromagnetized or magnetized to a specified first amount of electromagnetism or magnetism and to a specified second amount of electromagnetism or magnetism, said specified first amount of electromagnetism or magnetism representing a first specified binary logic bit and said specified second amount of electromagnetism or magnetism representing a second specified binary logic bit.

14. The one transistor static write and read and erase memory cell of claim 1 wherein said electromagnetic or magnetic element means is capable of being electromagnetized or magnetized to a plurality of electromagnetism or magnetism amounts, whereby each of said plurality of said electromagnetism or magnetism amounts is predetermined to represent a specified number of binary bits, said specified number of binary bits being all of the same binary logic level.

15. The one transistor static write and read and erase memory cell of claim 1 wherein said electromagnetic or magnetic element means is capable of being erased of a specified first electromagnetism or magnetism amount that represents a first specified binary logic bit and a specified second electromagnetism or magnetism amount that represents a second specified binary logic bit.

16. The one transistor static write and read and erase memory cell of claim 1 wherein said electromagnetic or magnetic element means is capable of being erased of a given amount of electromagnetism or magnetism amount that represents a specified total number of binary bits of the same binary logic level.

17. A method of reading data stored in a one bit one transistor static write and read and erase memory cell comprising the steps of:

(a) applying an appropriate voltage to said row select line so as to select said one transistor static write and read and erase memory cell for data reading;

(b) applying a predetermined amount of data read voltage to a data read bit line so as to cause a corresponding predetermined data read current to flow through a data read bit line means and through both terminals of a data reading element means, said data reading element means having a property of varying either a voltage or a resistance across both terminals of said data reading elements means in proportion to a present electromagnetic field or magnetic field in a specified direction, when said data read current is made to flow through said both terminal of said data reading element means, said electromagnetic field or magnetic field being provided by a predetermined amount of electromagnetism or magnetism induced in a data storage electromagnetic or magnetic element means by a data write current;

(c) letting said voltage across said terminals of said data reading element means act as a dependent input voltage, either by itself or when added to said data read voltage applied to said data read bit line means, to a data read input emitter terminal of a switching transistor of said one transistor static write and read and erase memory cell, said amount of said dependent input voltage being either a low input voltage that will result in a first specified amount of output voltage at the output stage of said switching transistor to represent one type of binary bit, or a high input voltage that will result in a second specified amount of output voltage at the output stage of said switching transistor to represent another type of binary bit;

(d) letting a column write and read and erase sense circuit means connected to said output stage of said switching transistor measure either said first specified amount of output voltage or said second specified amount of output voltage so as to determine the type of binary bit stored in said one transistor static write and read and erase memory cell;

(e) Letting said column write and read and erase sense circuit determine the emptiness of said one transistor static write and read and erase memory cell of any data stored therein by measuring an output voltage at said output stage of said switching transistor that is not equal to either said first specified output voltage or said second specified output voltage.

18. A method of reading data stored in a one and more than one bit one transistor static write and read and erase memory cell comprising the steps of:

(a) applying a predetermined voltage to a row select line so as to select said one transistor static write and read and erase memory cell for a data reading cycle;

(b) applying a predetermined voltage to a data read bit line means so as to cause a corresponding predetermined data read current to flow through said data read bit line means and through both terminals of a data reading element means, said data reading element means having a property of varying either the voltage or the resistance across said terminals when said data read current is made to flow through said terminals of said data reading element means in the presence of an electromagnetic field or a magnetic field crossing the body of said data reading element means in a specified direction, said electromagnetic field or magnetic field being provided by a given amount of electromagnetism or magnetism induced in an electromagnetic or magnetic element means by a data write current, the result of which is to produce a voltage across said data reading element means that is proportional to said electromagnetic field or magnetic field;

(c) determining that said data read voltage applied to said data read bit line means is of a sufficient minimum amount when applied to a data read input emitter terminal of said one transistor static write and read and erase memory cell to cause said switching transistor of said one transistor static write and read and erase memory cell, to immediately operate in the saturation mode, or to cause the voltage drop across said data read input emitter terminal and a collector terminal of said switching transistor to be constant or fixed;

(d) measuring a total voltage across a data-read circuit loop of said one transistor static write and read and erase memory cell using a column write and read and erase sense circuit means connected across said data read circuit loop;

(e) adding said data read voltage applied to said data read bit line means to the constant voltage drop between said data read input emitter terminal and said collector terminal so as to get a voltage subtotal amount using said column write and read and erase sense circuit means;

(f) subtracting said voltage subtotal amount from said total voltage across said data read circuit loop of said one transistor static write and read and erase memory cell so as to remain with an amount of said voltage across said data reading element means, said amount of said voltage across said data reading element means being directly proportional to a total number of binary bits of data of said allocated type stored in said one transistor static write and read and erase memory cell;

(g) using a column write and read and erase sense circuit means to divide said amount of said voltage across said data reading element means by a predetermined voltage amount specified to represent one binary bit of data of said allocated type so as to obtain a total number of binary bits of data of said allocated type stored in said one transistor static write and read and erase memory cell at a specified time;

(h) taking a copy of one binary bit of data of said allocated type measured by said column write and read and erase sense circuit means and gating said copy of said binary bit onto a digital system data bus channel to be transferred to another part of a digital system such as a microprocessor, of which said one transistor static write and read and erase memory cell is also an integral part.

19. A method of arranging data in a one transistor static write and read and erase memory cell array comprising the steps of:
- (a) determining a standard length of a word of data to be stored in said one transistor static write and read and erase memory cell array by specifying a maximum number of binary bits said word of data can contain;
- (b) allocating address space within said one transistor static write and read and erase memory cell array in such a manner that every possible unique way said maximum number of binary bits comprising said standard length of said word of data can be arranged results in the formation of a unique standard length word of data and said unique standard length word of data is allocated a corresponding unique standard length address space within said one transistor static write and read and erase memory cell array;
- (c) storing every said unique standard length word of data at the corresponding allocated unique standard length address space within said one transistor static write and read and erase memory cell array;
- (d) storing every additional said unique standard length word of data at said corresponding allocated unique standard length address space within said one transistor static write and read and erase memory cell array.

20. The method of claim 18 wherein said total voltage across said data read circuit loop is further realized by measuring an output voltage at said collector terminal of said switching transistor during said data reading cycle using said column write and read and erase sense circuit means connected to said collector terminal.

* * * * *